United States Patent
Ueda et al.

(10) Patent No.: US 6,420,057 B1
(45) Date of Patent: Jul. 16, 2002

(54) ORGANIC ELECTROLUMINESCENT ELEMENT

(75) Inventors: Noriko Ueda; Yoshiyuki Suzuri; Taketoshi Yamada; Hiroshi Kita, all of Hino (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 09/610,636

(22) Filed: Jul. 5, 2000

(30) Foreign Application Priority Data

Jul. 5, 1999 (JP) .......................................... 11-190287

(51) Int. Cl.$^7$ ............................................... H05B 33/14
(52) U.S. Cl. ....................... 428/690; 428/704; 428/917; 313/504; 313/506; 257/40; 257/103; 252/301.16; 252/301.26
(58) Field of Search ................................ 428/690, 704, 428/917; 313/504, 506; 252/301.16, 301.26; 257/40, 103

(56) References Cited

U.S. PATENT DOCUMENTS

| 5,405,709 A | 4/1995 | Littman et al. |
|---|---|---|
| 5,755,999 A | 5/1998 | Shi et al. |

FOREIGN PATENT DOCUMENTS

| EP | 0 818 512 A1 | 1/1998 | |
|---|---|---|---|
| JP | 59-194393 | 11/1984 | |
| JP | 63-295695 | 12/1988 | |
| JP | 09328679 | * 12/1997 | ........... C09K/11/06 |
| WO | WO 98/36035 | 8/1998 | |

OTHER PUBLICATIONS

Tanaka et al., "Novel Metal–chelate emitting materials based on polycyclic aromatic ligands for electroluminescent devices"; *Journal of Materials Chemistry*, Cambridge, vol. 8, No. 9, 1998; pp. 1999–2003, XP000801917.
Patent Abstracts of Japan, vol. 1997, No. 05, May 30, 1997, of JP 09 020885 A, Jan. 21, 1997.

* cited by examiner

*Primary Examiner*—Cynthia H. Kelly
*Assistant Examiner*—Ling Xu
(74) *Attorney, Agent, or Firm*—Frishauf, Holtz, Goodman, Langer & Chick, P.C.

(57) ABSTRACT

An organic electroluminescent element comprising a light emission layer comprised of single or plural thin layers of an organic compound put between an anode and a cathode facing to each other is disclosed. At least one of the thin layer of the organic compound contains an organic metal complex having both of an ionic coordinate bond formed between a nitrogen anion and a metal cation and a coordinate bond formed by a nitrogen atom or a chalcogen and a metal.

14 Claims, No Drawings

ORGANIC ELECTROLUMINESCENT ELEMENT

FIELD OF THE INVENTION

This invention relates to a material of organic electroluminescent element and an organic electroluminescent element (hereinafter referred to an organic EL), particularly relates to a material of organic EL element and an organic electroluminescent element excellent in the luminance of the light emitted thereby.

BACKGROUND OF THE INVENTION

An inorganic electroluminescent element has been used for a plane-shaped light source, and a high voltage alternating current has been required to drive such the element.

An organic electroluminescent element recently developed is constituted by a thin layer containing a fluorescent organic compound arranged between a cathode and an anode, and an electron and a positive hole were injected into the thin layer to form an exciton by recombination of the electron and the positive hole. The element emits light utilizing the generation of light, fluorescent light or phosphorescent light, by the inactivation of the exciton. The element can emit light by applying a relatively low voltage such as from several to several decade volts, the element is excellent in the dependency of viewing angle and in the visuality since the element is self light emission type, and the element is a complete solid element. Accordingly, such the element is noted from the viewpoint of the space saving and portability.

Various organic EL elements have been reported. For example, Appl. Phys. Lett. Vol. 51, p. 913, and Japanese Patent Publication to Open Inspection (hereinafter referred to JP O.P.I.) No. 59-194393 disclose an element having a combination of a positive hole injection layer and an organic fluorescent layer, JP O.P.I. No. 63-295695 discloses one having a combination of a positive hole injection layer and an electron injection and transportation layer, and Jpn. Journal of Applied Physics, Vol. 127, No. 2, p.p. 269–271 discloses one having a combination of a positive hole transportation layer, a light emission layer and an electron transportation layer.

However, further raising in the energy conversion efficiency and the light emission quantum efficiency are required and a problem of short lifetime of light emission is pointed out. Factors such as decomposition of the organic compound constituting the thin layer and crystallization of the organic compound in the thin layer which are caused by the organic compound used for the material of the organic EL element are pointed out as the reason of lowering of the luminance in the period of time even though the reason is not completely elucidated yet.

SUMMARY OF THE INVENTION

The object of the invention is to provide a material of organic electroluminescent element and an organic electroluminescent element excellent in the light emission efficiency and is capable of emitting high luminance light.

The object can be attained by the following constitution.
(1) An organic electroluminescent element comprising a light emission layer comprised of single or plural thin layers of an organic compound put between an anode and a cathode facing to each other, in which at least one of the thin layer of the organic compound contains an organic metal complex having both of an ionic coordinate bond formed between a nitrogen anion and a metal cation and a coordinate bond formed by a nitrogen atom or a chalcogen and a metal.

(2) An organic electroluminescent element comprising a light emission layer comprised of single or plural thin layers of an organic compound put between an anode and a cathode facing to each other, in which at least one of the thin layer of the organic compound contains an organic metal complex having both of an ionic coordinate bond formed by a nitrogen anion included in an aromatic heterocyclic ring and a metal cation and a coordinate bond formed between a nitrogen atom or a chalcogen and a metal.

(3) The organic electroluminescent element described in (2) in which a substituent of the nitrogen anion-containing aromatic heterocyclic ring forming the ionic coordinate bond with the metal cation has a Hammett's σp value of from −1.00 to 0.65.

(4) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula I and a metal cation,

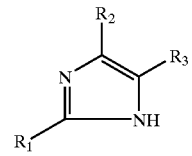

Formula I wherein $R_1$, $R_2$ and $R_3$ are each a hydrogen atom or a substituent having a Hammett's value of from −1.00 to 0.65, $R_2$ and $R_3$ may be bonded with each other to form a ring condensed with the imidazole ring, and at least one of $R_1$, $R_2$ and $R_3$ has a nitrogen atom or a chalcogen atom at a position far from 2 or 3 atoms from the nitrogen atom forming an ionic coordinate bond with a metal cation.

(5) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula II and a metal cation,

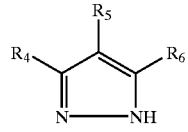

Formula II wherein $R_4$, $R_5$ and $R_6$ are each a hydrogen atom or a substituent, $R_4$ and $R_5$ or $R_5$ and $R_6$ may be bonded with each other to a ring condensed with the pyrazole ring, and at least one of $R_4$, $R_5$ and $R_6$ has a nitrogen atom or a chalcogen atom at a position far from 2 or 3 atoms from the nitrogen atom forming an ionic coordinate bond with a metal cation.

(6) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula III and a metal cation, Formula III

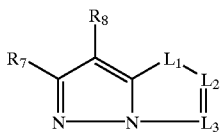

wherein $L_1$ is an $—N(R_9)—$ group or a $—C(R_{10})(R_{11})—$ group, $L_2$ is a nitrogen atom or a $—C(R_{12})=$ group, $L_3$ is a nitrogen atom or a $=C(R_{13})—$ group, $R_7$, $R_8$, $R_9$, $R_{10}$, $R_{11}$, $R_{12}$ and $R_{13}$ are each a hydrogen atom or a substituent, $R_7$ and $R_8$ may be bonded with each other to form a ring condensed with the pyrazole ring, and at least one of $R_7$ through $R_{13}$ has a nitrogen atom or a chalcogen atom at a position far from 2 or 3 atoms from the nitrogen atom forming an ionic coordinate bond with a metal cation.

(7) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula IV and a metal cation, Formula IV

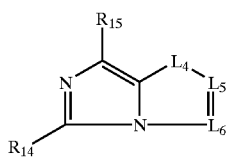

wherein $L_4$ is an $—N(R_{16})—$ group or a $—C(R_{17})(R_{18})—$ group, $L_5$ is a nitrogen atom or a $—C(R_{19})=$ group, $L_6$ is a nitrogen atom or a $=C(R_{20})—$ group, $R_{14}$, $R_{15}$, $R_{16}$, $R_{17}$, $R_{18}$, $R_{19}$ and $R_{20}$ are each a hydrogen atom or a substituent, and at least one of $R_{14}$ through $R_{20}$ has a nitrogen atom or a chalcogen atom at a position far from 2 or 3 atoms from the nitrogen atom forming an ionic coordinate bond with a metal cation.

(8) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula V and a metal cation, Formula V

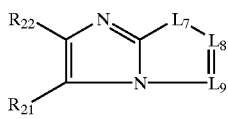

wherein $L_7$ is an $—N(R_{23})—$ group or a $—C(R_{24})(R_{25})—$ group, $L_8$ is a nitrogen atom or a $—C(R_{26})=$ group, $L_9$ is a nitrogen atom or a $=C(R_{27})—$ group, $R_{21}$, $R_{22}$, $R_{23}$, $R_{24}$, $R_{25}$, $R_{26}$ and $R_{27}$ are each a hydrogen atom or a substituent, $R_{21}$ and $R_{22}$ may be bonded with each other to form a ring condensed with the pyrazole ring, and at least one of $R_{21}$ through $R_{27}$ has a nitrogen atom or a chalcogen atom at a position far from 2 or 3 atoms from the nitrogen atom forming an ionic coordinate bond with a metal cation.

(9) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula VI and a metal cation, Formula VI

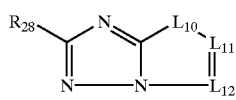

wherein $L_{10}$ is an $—N(R_{29})—$ group or a $—C(R_{30})(R_{31})—$ group, $L_{11}$ is a nitrogen atom or a $—C(R_{32})=$ group, $L_{12}$ is a nitrogen atom or a $=C(R_{33})—$ group, $R_{28}$, $R_{29}$, $R_{30}$, $R_{31}$, $R_{32}$, and $R_{33}$ are each a hydrogen atom or a substituent, and at least one of $R_{28}$ through $R_{33}$ has a nitrogen atom or a chalcogen atom at a position far from 2 or 3 atoms from the nitrogen atom forming an ionic coordinate bond with a metal cation.

(10) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula VII and a metal cation, Formula VII

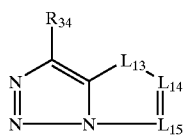

wherein $L_{13}$ is an $—N(R_{35})—$ group or a $—C(R_{36})(R_{37})—$ group, $L_{14}$ is a nitrogen atom or a $—C(R_{38})=$ group, $L_{15}$ is a nitrogen atom or a $=C(R_{39})—$ group, $R_{34}$, $R_{35}$, $R_{36}$, $R_{37}$, $R_{38}$ and $R_{39}$ are each a hydrogen atom or a substituent, and at least one of $R_{34}$, $R_{35}$, $R_{36}$, $R_{37}$, $R_{38}$ and $R_{39}$ has a nitrogen atom or a chalcogen atom at a position far from 2 or 3 atoms from the nitrogen atom forming an ionic coordinate bond with a metal cation.

(11) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula VIII and a metal cation, Formula VIII

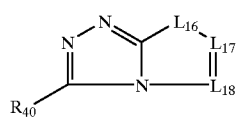

wherein $L_{16}$ is an $—N(R_{41})—$ group or a $—C(R_{42})(R_{43})—$ group, $L_{17}$ is a nitrogen atom or a $—C(R_{44})=$ group, $L_{18}$ is a nitrogen atom or a $=C(R_{45})—$ group, $R_{40}$, $R_{41}$, $R_{42}$, $R_{43}$, $R_{44}$ and $R_{45}$ are each a hydrogen atom or a substituent, and at least one of $R_{40}$ through $R_{45}$ has a nitrogen atom or a chalcogen atom at a position far from 2 or 3 atoms from the nitrogen atom forming an ionic coordinate bond with a metal cation.

(12) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula IX and a metal cation,

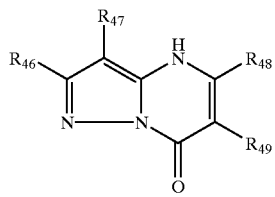

Formula IX wherein $R_{46}$, $R_{47}$, $R_{48}$ and $R_{49}$ are each a hydrogen atom or a substituent, $R_{46}$ and $R_{47}$ may be bonded with each other to form a ring condensed with the pyrazole ring, $R_{48}$ and $R_{49}$ may be bonded with each other to form a ring condensed with the imidazole ring, and at least one of $R_{46}$ through $R_{49}$ has a nitrogen atom or a chalcogen atom at a position far from 2 or 3 atoms from the nitrogen atom forming an ionic coordinate bond with a metal cation.

(13) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula X and a metal cation,

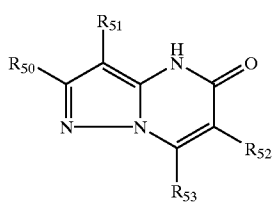

Formula X wherein $R_{50}$, $R_{51}$, $R_{52}$ and $R_{53}$ are each a hydrogen atom or a substituent, $R_{50}$ and $R_{51}$ may be bonded with each other to form a ring condensed with the pyrazole ring, $R_{52}$ and $R_{53}$ may be bonded with each other to form a ring condensed with the pyrimidine ring, and at least one of $R_{50}$ through $R_{53}$ has a nitrogen atom or a chalcogen atom at a position far from 2 or 3 atoms from the nitrogen atom forming an ionic coordinate bond with a metal cation.

(14) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XI and a metal cation,

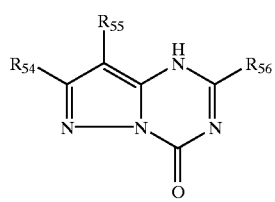

Formula XI wherein $R_{54}$, $R_{55}$ and $R_{56}$ are each a hydrogen atom or a substituent, $R_{54}$ and $R_{55}$ may be bonded with each other to form a ring condensed with the pyrazole ring, and at least one of $R_{54}$, $R_{55}$ and $R_{56}$ has a nitrogen atom or a chalcogen atom at a position far from 2 or 3 atoms from the nitrogen atom forming an ionic coordinate bond with a metal cation.

(15) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XII and a metal cation,

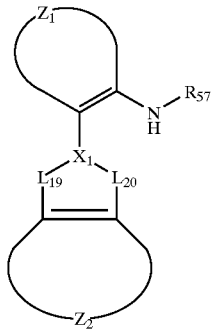

Formula XII wherein $Z_1$ and $Z_2$ are each a group of atoms necessary to form a 5- or 6-member ring, $R_{57}$ is a substituent, $X_1$ is a nitrogen atom or a carbon atom wherein one of bonds of $X_1$ to $L_{19}$ and $X_1$ to $L_{20}$ in case that $X_1$ is a carbon atom, one of a 5-member ring formed by $X_1$, $L_{19}$ and $L_{20}$ and a ring formed by $X_1$, $L_{19}$, $L_{20}$ and $Z_2$ is an aromatic ring. $L_{19}$ and $L_{20}$ are each an —N=, an —N($R_{58}$)— group, an —O—, an —S— or a —Se—, and $R_{58}$ is a substituent.

(16) An organic electroluminescent element comprising a light emission layer comprised of single or plural thin layers of an organic compound put between an anode and a cathode facing to each other, in which at least one of the thin layer of the organic compound contains an organic metal complex having a coordination bond formed by an oxygen anion and metal cation and a coordination bond formed between nitrogen or chalcogen atom and metal.

(17) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XIII or Formula XIV and a metal cation,

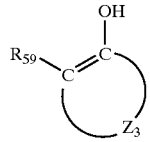

Formula XIII

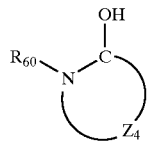

Formula XIV wherein $Z_3$ and $Z_4$ are groups of atoms necessary to form an aromatic heterocyclic rings respectively with the —C($R_{59}$)=C(OH) group or the —N($R_{60}$)—C(OH)— group, the aromatic heterocyclic ring may have a substituent and the substituents adjacent with each other may be bonded to form a ring condensed with the aromatic heterocyclic ring, and $R_{59}$ and $R_{60}$ are each a heterocyclic ring containing one or two nitrogen atoms and one of the nitrogen atom is at position-1 or position-2 of the ring.

(18) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XV or Formula XVI and a metal cation, Formula XV

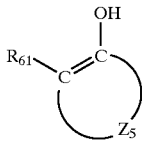

Formula XVI

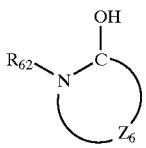

wherein $Z_5$ and $Z_6$ are groups of atoms necessary to form an aromatic heterocyclic rings, respectively, with the —C($R_{61}$)=C(OH)— group or the —N($R_{62}$)—C(OH)— group, the aromatic heterocyclic ring may have a substituent and the substituents adjacent with each other may be bonded to form a ring condensed with the aromatic heterocyclic ring, and $R_{61}$ and $R_{62}$ are each a heterocyclic ring having a chalcogen atom at position-1 or position-2 of the ring.

(19) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XVII or Formula XVIII and a metal cation, Formula XVII

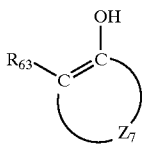

Formula XVIII

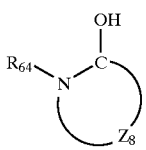

wherein $Z_7$ and $Z_8$ are groups of atoms necessary to form an aromatic heterocyclic rings, respectively, with the —C($R_{63}$)=C(OH)— group or the —N($R_{64}$)—C(OH)— group, the aromatic heterocyclic ring may have a substituent and the substituents adjacent with each other may be bonded to form a ring condensed with the aromatic heterocyclic ring, and $R_{63}$ and $R_{64}$ are each a non-cyclic substituent having a nitrogen atom or a chalcogen atom at position-1 or position-2 thereof.

(20) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XIX and a metal cation, Formula XIX

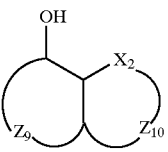

wherein $Z_9$ is a group of atoms necessary to form a 5-member aromatic heterocyclic ring, $X_2$ is a nitrogen atom or a chalcogen atom, $Z_{10}$ and $Z_9$ are each a group of atoms necessary to form a condensed ring, the condensed ring may has a substituent and may further form a condensed ring.

(21) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XX and a metal cation, Formula XX

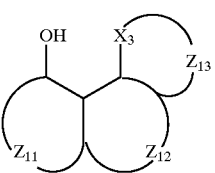

wherein $Z_{11}$ is a group of atoms necessary to form a 5-member aromatic heterocyclic ring, $X_3$ is a nitrogen or chalcogen atom, $Z_{12}$ and $Z_{13}$ are each a group of atoms necessary to form a condensed ring together with $Z_{11}$ and $Z_{12}$, respectively, the condensed ring may have a substituent and may further form a condensed ring.

(22) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XXI and a metal cation, Formula XXI

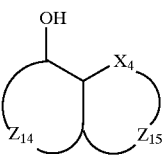

wherein $Z_{14}$ is a group of atoms necessary to form a 6-member aromatic carbon hydride ring or a 6-member aromatic heterocyclic ring, $X_4$ is a nitrogen atom or a chalcogen atom, $Z_{15}$ is a group of atoms necessary to form a 5-member aromatic carbon hydride ring or a 5-member aromatic heterocyclic ring by condensing with $Z_{14}$, the condensed ring may have a substituent and may further form a condensed ring.

(23) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XXII and a metal cation, Formula XXII

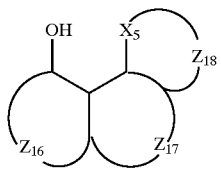

wherein $Z_{16}$ is a group of atoms necessary to form a 6-member aromatic carbon hydride or a 6-member aromatic heterocyclic ring, $X_5$ is a nitrogen atom or a chalcogen atom, $Z_{17}$ and $Z_{18}$ are each a group of atoms necessary to form a 5-member aromatic heterocyclic ring by condensing with $Z_{16}$ and $Z_{17}$, respectively, the condensed ring may have a substituent and may further form a condensed ring.

(24) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XXIII and a metal cation, Formula XXIII

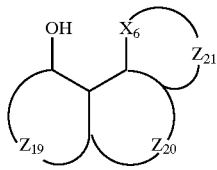

wherein $Z_{19}$ is a group of atoms necessary to form a 6-member aromatic carbon hydride ring or a 6-member aromatic heterocyclic ring, $X_6$ is a nitrogen atom or a chalcogen atom, $Z_{20}$ is a group of atoms necessary to form a 5-member aromatic heterocyclic ring by condensing with $Z_{19}$, $Z_{21}$ is a group of atoms necessary to form a 6-member aromatic carbon hydride ring or a 6-member aromatic heterocyclic ring by condensing with $Z_{20}$, the condensed ring may have a substituent and may further form a condensed ring.

(25) An organic electroluminescent element comprising a light emission layer comprised of single or plural thin layers of an organic compound put between an anode and a cathode facing to each other, in which at least one of the thin layer of the organic compound contains a salt of the anion of a compound represented by Formula XXIV and a metal cation, Formula XXIV

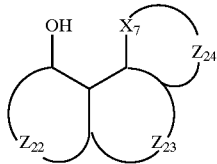

wherein $Z_{22}$ is a group of atoms necessary to form a 6-member aromatic carbon hydride ring or a 6-member aromatic heterocyclic ring, $X_7$ is a nitrogen atom or a chalcogen atom, $Z_{23}$ is a group of atoms necessary to form a 6-member aromatic carbon hydride or aromatic heterocyclic ring by condensing with $Z_{22}$, $Z_{24}$ is a group of atoms necessary to form a 5-member aromatic heterocyclic ring by condensing with $Z_{23}$, the condensed ring may have a substituent and may further form a condensed ring.

The organic electroluminescent element described in one of the foregoing (1) through (24) in which the metal element of the metal cation of the organic metal complex is Al, Ga, In, Tl, Be, Mg, Sr, Ba, Ca, Zn, Cd, Hg, Pd or Cu.

DETAILED DESCRIPTION OF THE INVENTION

The present invention is described more in detail as follows.

Coordinate bond means the bond which bond atom is provided from only one atom in σ bond between two atoms. For example, a bond of aluminum ion and oxygen anion in tris (8-hydroxyquinolinate) aluminum (Alq3), or a bond of ferrous ion and nitrogen atom in tris (1,10-phenanthroline) iron (II) ion is represented. Ionic coordinate bond is the same meaning as the former.

In the present invention a nitrogen atom or a chalcogen atom is contained at a position far from 2 or 3 atoms from the nitrogen atom forming an ionic coordinate bond with a metal cation means that a part of nitrogen atom forming an ionic coordinate bond with a metal cation of the compound of formula (I) to (XII) is represented by following formula (XXV).

$$R'—X_8—(A_3)n—A_2—A_1—N \qquad \text{Formula (XXV)}$$

In the formula, each of $A_1$, $A_2$ and $A_3$ represents a substituted or non-substituted methine group or a nitrogen atom, n is 0 or 1, $X_8$ is a nitrogen atom or a chalcogen atom, and R' is a hydrogen atom or a substituent.

The value of σp of a substituent in the present invention is the substituent constant defined by Hammet, which is described in, for example, "Structural activity correlation of drug" Kagaku no ryoiki, extra number 122, pages 96–103, published by Nankodo.

In claim 3, a hydrogen atom is supposed to be substituent having σp value of 0.00.

A compound represented by formulas (I) to (XXIV) of the present invention is described in detail.

In the formula (I) mentioned above, $R_1$ to $R_3$ represents each, a hydrogen atom or substituent having Hammet's σp of −1.0 to 0.65. The substituent includes halogen atom (fluorine, chlorine), alkyl group (methyl, ethyl, i-propyl, hydroxyethyl, methoxymethyl, trifluoromethyl, t-butyl), cycloalkyl group (cyclopentyl, cyclohexyl), aralkyl group (benzyl, 2-phenethyl), aryl (phenyl, naphthyl, p-tolyl, p-chlorophenyl), alkoxy group (methoxy, ethoxy, i-propoxy, butoxy), aryloxy group (phenoxy), acylamino group (acetylamino, propionyl amino), alkylthio group (methylthio, ethylthio, butylthio), arylthio group (phenylthio), sulfonyl amino group (methanesulfonyl amino, benzenesulfonyl amino), ureide group (3-methyl ureide, 3,3-dimethyl ureide, 1,3-dimethyl ureide), sulfamoyl amino group (dimethyl sulfamoyl amino), carbamoyl group (methyl carbamoyl, ethyl carbamoyl, dimethylcarbamoyl), sulfamoyl group (ethyl sulfamoyl, dimethyl sulfamoyl), alkoxycarbonyl group (methoxycarbonyl, ethoxycarbonyl), aryloxy carbonyl group (phenoxy carbonyl), sulfonyl group (methanesulfonyl, butane sulfonyl, phenylsulfonyl), acyl group (acetyl, propanoyl, butyloyl), amino group (methylamino, ethylamino, dimethylamino), hydroxyl group, nitro group, nitroso group, amine oxide group (pyridine oxide), imide group (phthalimide), disulfide group (benzol disulfide, benzothiazolyl-2-disulfide), carboxyl group, sulfo group, heterocyclic group (pyrrole, pyrrolidyl, pyrazolyl, imidazolyl, pyridyl, benzimidazolyl, benzthiazolyl, benzoxazolyl). These groups may be substituted furthermore.

In the formulas (II) to (XXIV) mentioned above, $R_4$ to $R_{56}$ represents each, a hydrogen atom or substituent, and $R_{57}$ and $R_{58}$ represent a substituent, each of which may form a condensed ring. The substituent includes halogen atom (fluorine, chlorine), alkyl group (methyl, ethyl, i-propyl, hydroxyethyl, methoxymethyl, trifluoromethyl, t-butyl), cycloalkyl group (cyclopentyl, cyclohexyl), aralkyl group (benzyl, 2-phenethyl), aryl (phenyl, naphthyl, p-tolyl, p-chlorophenyl), alkoxy group (methoxy, ethoxy, i-propoxy, butoxy), aryloxy group (phenoxy), cyano group, acylamino group (acetylamino, propionyl amino), alkylthio group (methylthio, ethylthio, butylthio), arylthio group (phenylthio), sulfonyl amino group (methanesulfonyl amino, benzenesulfonyl amino), ureide group (3-methyl ureide, 3,3-dimethyl ureide, 1,3-dimethyl ureide), sulfamoyl amino group (dimethyl sulfamoyl amino), carbamoyl group (methylcarbamoyl, ethyl carbamoyl, dimethylcarbamoyl), sulfamoyl group (ethyl sulfamoyl, dimethyl sulfamoyl), alkoxycarbonyl group (methoxycarbonyl, ethoxycarbonyl), aryloxy carbonyl group (phenoxy carbonyl), sulfonyl group (methanesulfonyl, butane sulfonyl, phenylsulfonyl), acyl group (acetyl, propanoyl, butyloyl), amino group (methylamino, ethylamino, dimethylamino), hydroxyl group, nitro group, nitroso group, amine oxide group (pyridine oxide), imide group (phthalimide), disulfide group (benzol disulfide, benzothiazolyl-2-disulfide), carboxyl group, sulfo group, heterocyclic group (pyrrole, pyrrolidyl, pyrazolyl, imidazolyl, pyridyl, benzimidazolyl, and benzthiazolyl, benzoxazolyl). These groups may be substituted furthermore.

Examples of 5- or 6-member ring containing $Z_1$, $Z_2$ and $Z_{12}$ in the formula (XII) and (XX) include benzene, cyclopentane, cyclohexane, furan, thiophene, pyrrole, imidazole, pyrazole, 1,2,4-triazole, 1,2,3-triazole, oxazole, thiazole, isoxazole, isothiazole, pyridine, pyrazine, pyrimidine, pyridazine and 1,3,5-triazine. These rings may be substituted, or form a condensed ring furthermore.

Examples of aromatic heterocycle containing $Z_3$ to $Z_8$, $Z_9$, $Z_{11}$, and $Z_{14}$ to $Z_{24}$ in the formulas (XIII) to (XXIV) include furan, thiophene, pyrrole, imidazole, pyrazole, 1,2,4-triazole, 1,2,3-triazole, oxazole, thiazole, isoxazole, isothiazole, pyridine, pyrazine, pyrimidine, pyridazine, 1,3,5-triazine.

These rings may be substituted or form a condensed ring furthermore.

Examples of $R_{59}$ and $R_60$ in the formula (XIII) and (XIV) include pyrrolyl, pyrrolidyl, pyrazolyl, imidazolyl, furazyl, pyridyl, quinolyl, thiazolyl, oxazolyl, pyrazyl, pyrimidyl, pyridazinyl.

These groups may be substituted or and condensed ring may be formed by bonding neighboring substituent bonds mutually.

Examples of $R_{61}$ and $R_{62}$ in the formulas (XV) and (XVI) include each group of furyl, thiophenyl, oxazolyl, thiazolyl, isoxazolyl, isothiazolyl, furazyl, oxolanyl, oxanyl, and thiane.

Examples of $R_{63}$ and $R_{64}$ in the formula (XVII) and (XVIII) include alkoxy group (methoxy, ethoxy, i-propoxy, butoxy), aryloxy group (phenoxy), alkylthio group (methylthio, ethylthio, butylthio), arylthio group (phenylthio), sulfonamide group (methanesulfonamide, benzenesulfonamido), ureide group (3-methyl ureide, 3,3-dimethyl ureide, 1,3-dimethyl ureide), sulfamoylamino group (dimethyl sulfamoylamino), carbamoyl group (methylcarbamoyl, ethylcarbamoyl, dimethylcarbamoyl), sulfamoyl group (ethylsulfamoyl, dimethyl sulfamoyl), alkoxycarbonyl group (methoxycarbonyl, ethoxycarbonyl), aryloxy carbonyl group (phenoxy carbonyl), sulfonyl group (methanesulfonyl, butanesulfonyl, benzenesulfonyl), amino group (methylamino, ethylamino, dimethylamino).

These groups may be substituted furthermore.

Examples of 5 member aromatic heterocycle containing $Z_9$, $Z_{11}$, $Z_{15}$, $Z_{17}$, $Z_{18}$, 20 and $Z_{21}$ in the formulas (XIX) to (XXIV) include furan, thiophene, pyrrole, imidazole, pyrazole, 1,2,4-triazole, 1,2,3-triazole, oxazole, thiazole, isoxazole, and isothiazole. These rings may form a condensed ring.

Examples of 6 member aromatic hydrocarbon ring or aromatic heterocycle containing $Z_{14}$, $Z_{16}$, $Z_{19}$ and $Z_{22}$ in the formulas (XXI) to (XXIV), include benzene, pyridine, pyrazine, pyrimidine, pyridazine, and 1,3,5-triazine. These rings may form a condensed ring.

Examples of 6 member aromatic heterocycle containing $Z_{21}$ in the formula (XXIII) include pyridine, pyrazine, pyrimidine, pyridazine, 1,3,5-triazine. These ring may form a condensed ring.

The metal ion forming organometallic complex of a compound represented by formula (I) to (XXIV) with an anion is preferably divalent or trivalent. Preferable examples thereof include cation of Al, Ga, Be and Zn. More preferably are cation of Al, Be, Zn, and cation of Al is preferable in particular.

The anion of organic compound of the invention is an anion prepared by withdrawing the proton from the compound which contains a dissociative proton as shown by, for example, the formula (I) to (XXIV). For example, in an imidazole in the formula (I), the anion is represent by formula shown below, as well as its tautomer of formula, without restriction.

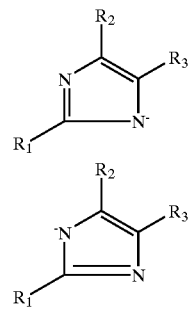

For example, an anion of 1H-pyrazolo[5,1-c][1,2,4] pyrazolotriazole can be described in two ways;

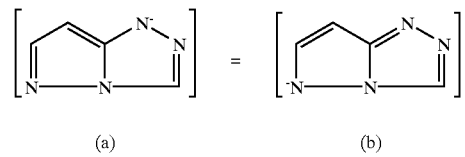

(a)                      (b)

and, for example, the salt of the metal cation includes also structure (b) even when the structure (a) is described only.

The atom which is condensation parts of condensed ring of the compound represented by formula (XIX) to (XXIV), may be nitrogen atom or carbon atom. For example, when numbers are given to an atom in indolizine as follows, condensation department of condensed ring means the fourth nitrogen atom and the ninth carbon atom.

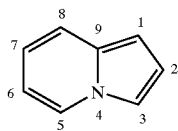
Concrete examples of salt of anion of a compound represented by formula (I)–(XIV) with metal cation employed in the present invention is shown in the following. It is not limited to these.
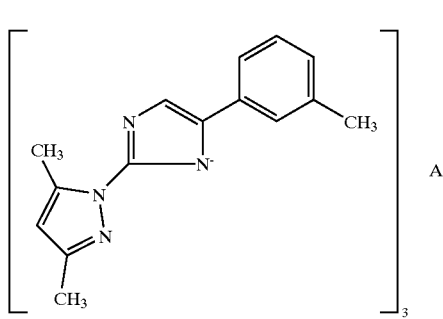
I-1
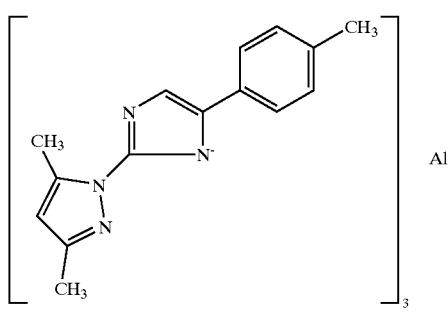
I-2
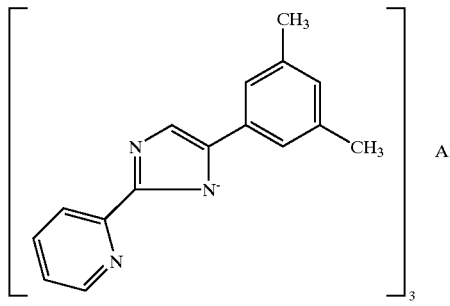
I-3
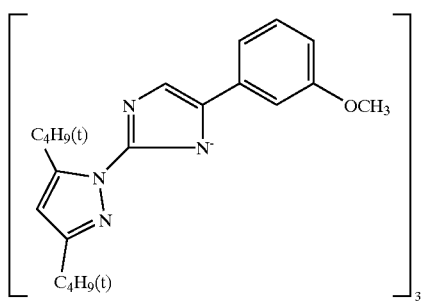
I-4
-continued
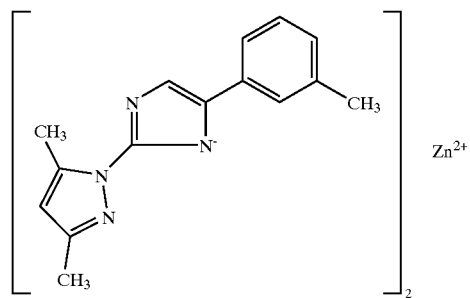
I-5
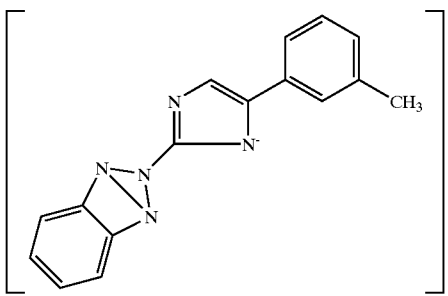
I-6
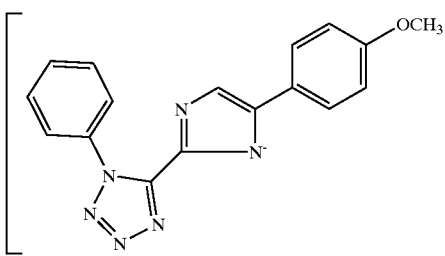
I-7
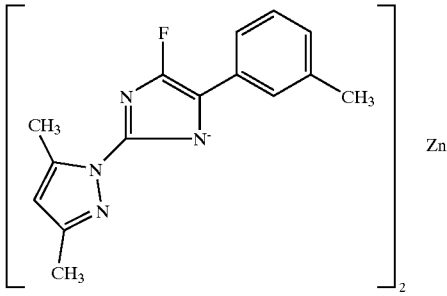
I-8
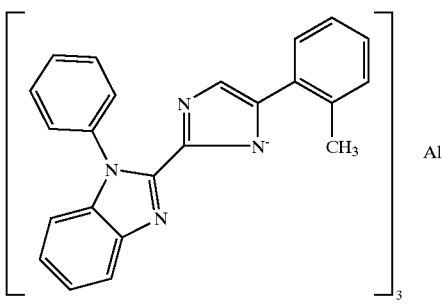
I-9

I-10
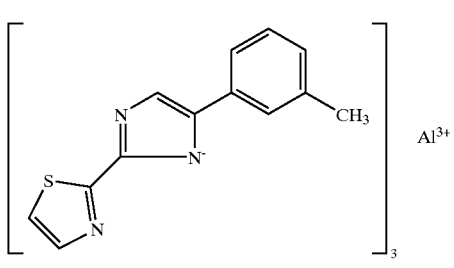
I-11
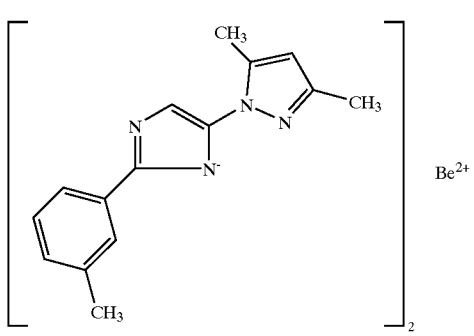
I-12
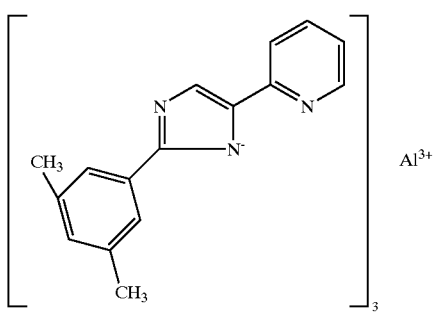
I-13
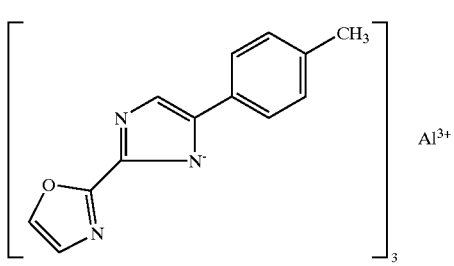
I-14
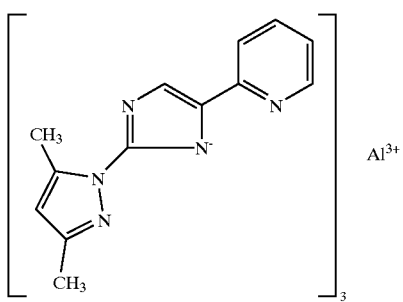
I-15
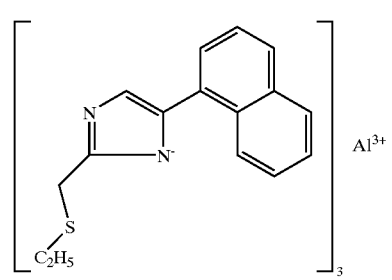
I-16
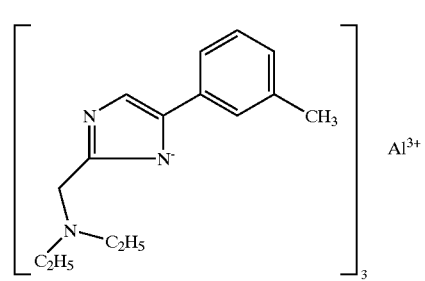
I-17
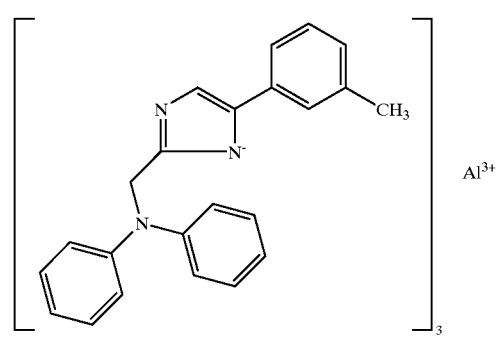
I-18
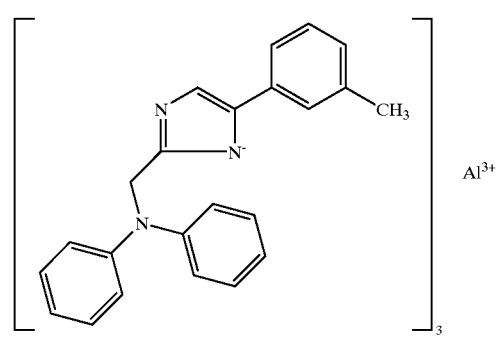
I-19
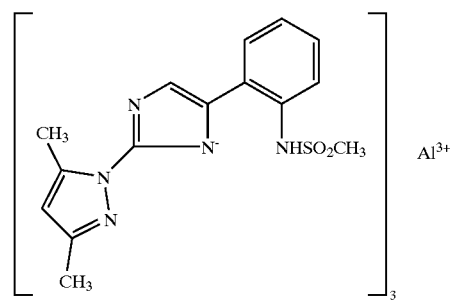

-continued
I-20
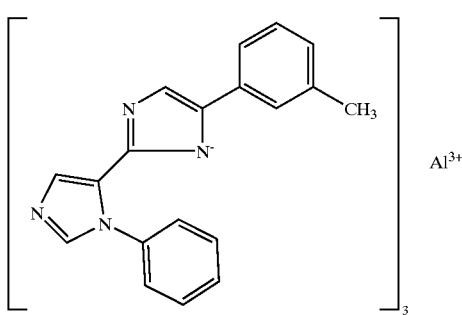
I-21
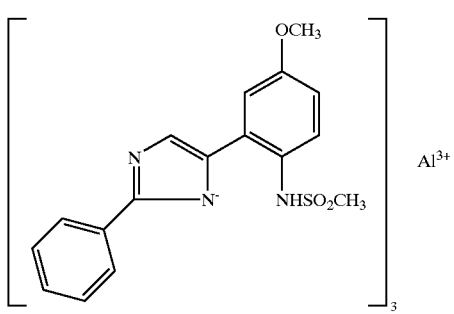
I-22
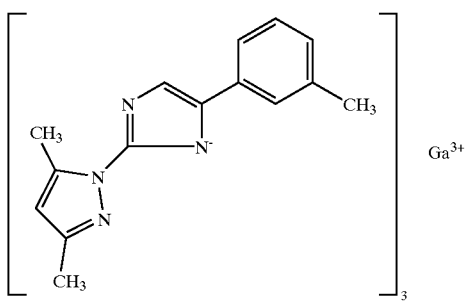
I-23
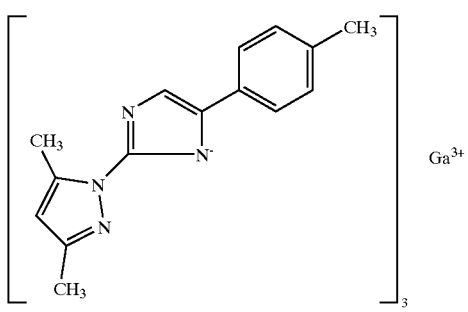
I-24
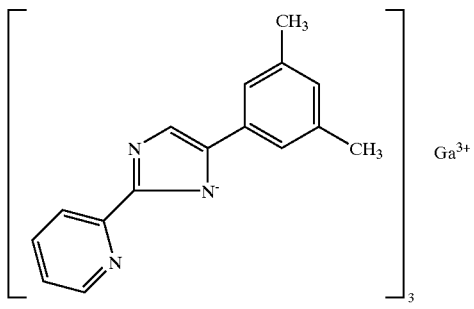
-continued
I-25
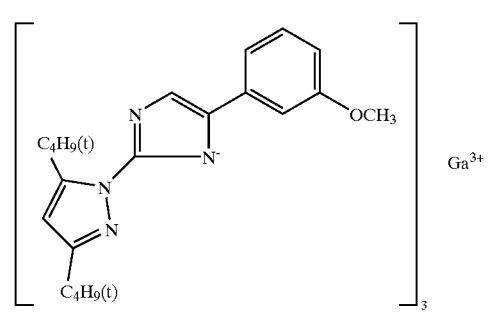
I-26
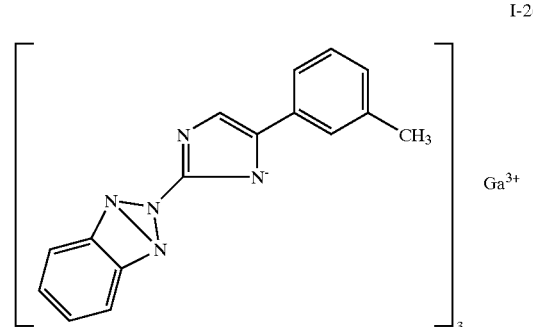
I-27
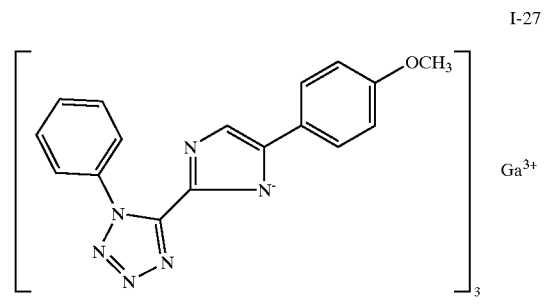
I-28
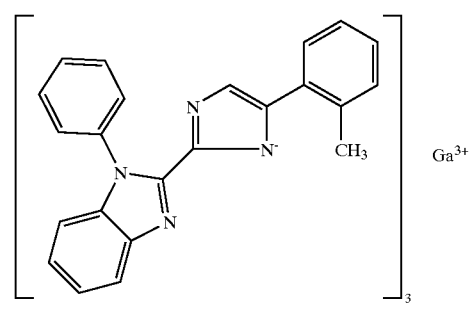
I-29
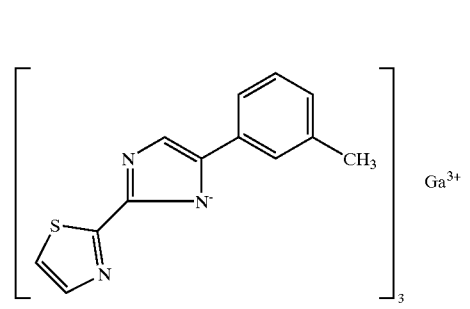

-continued
I-30
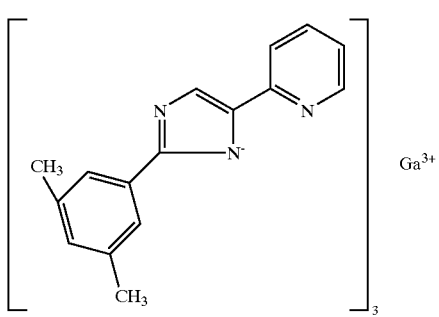
I-31
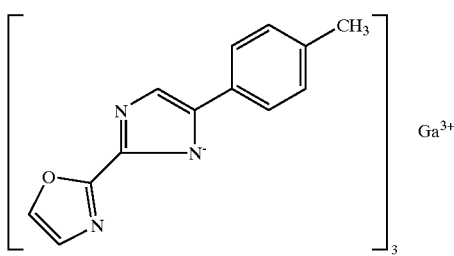
I-32
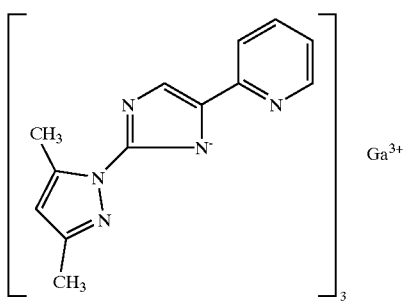
I-33
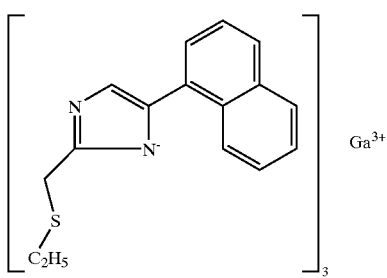
I-34
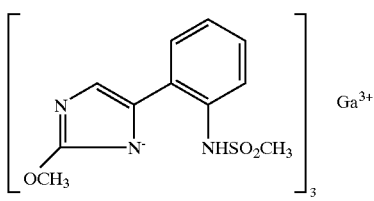
I-35
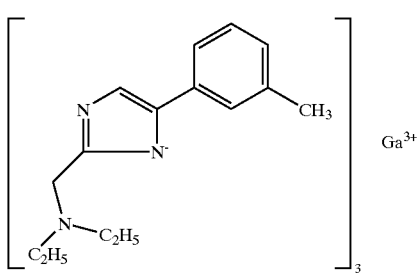
-continued
I-36
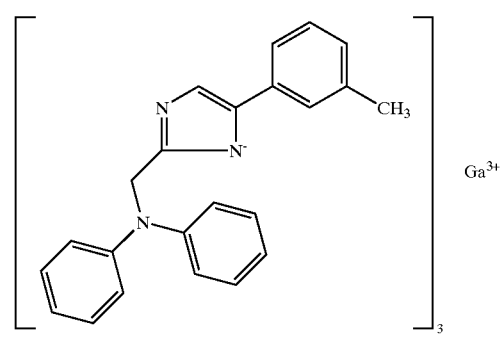
I-37
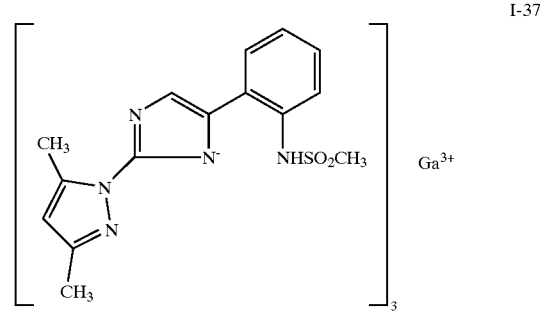
I-38
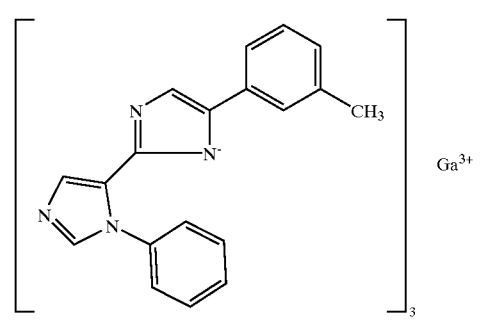
I-39
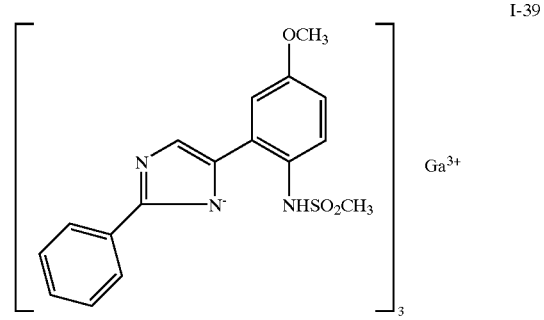
II-1
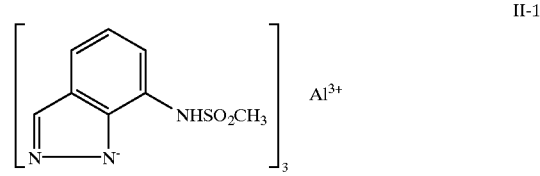
II-2
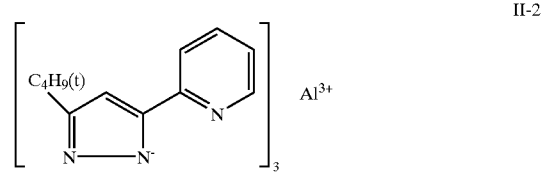

II-3
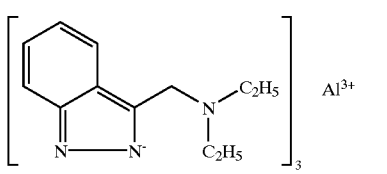
II-4
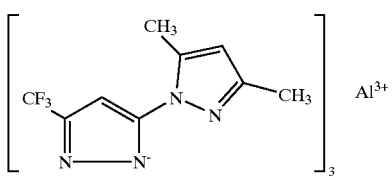
II-5
II-6
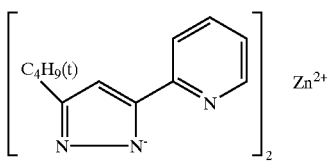
II-7
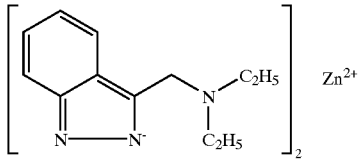
II-8
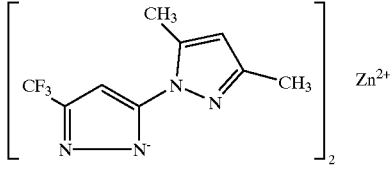
II-9
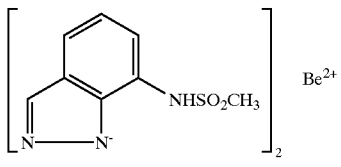
II-10
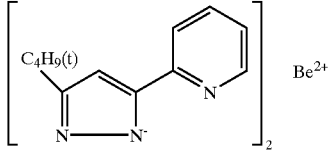
II-11
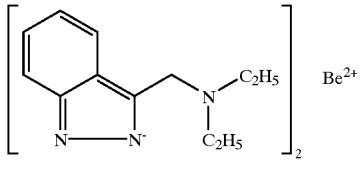
II-12
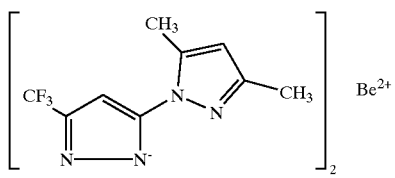
II-13
II-14
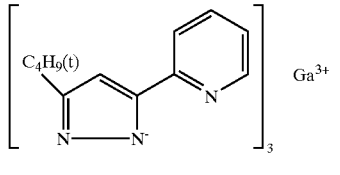
II-15
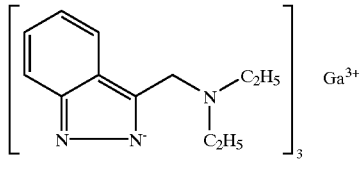
II-16
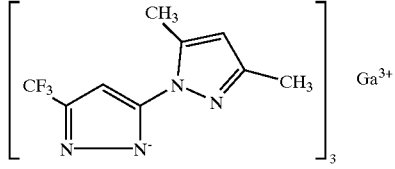
III-1
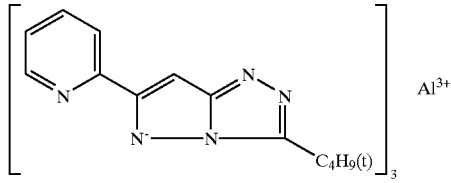
III-2
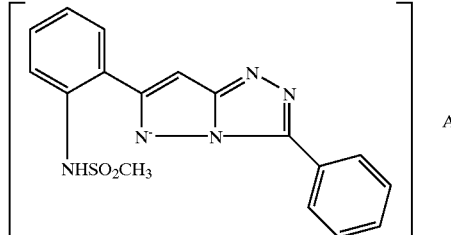
III-3
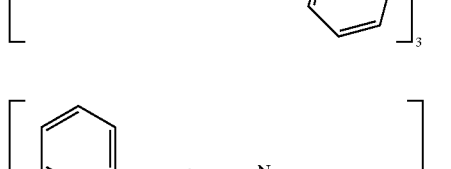
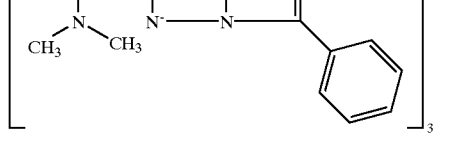

III-4
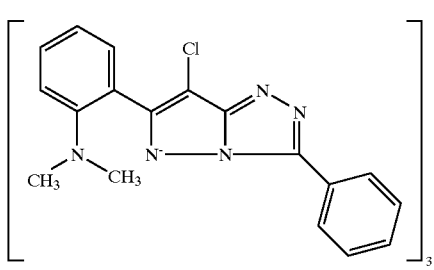
III-5
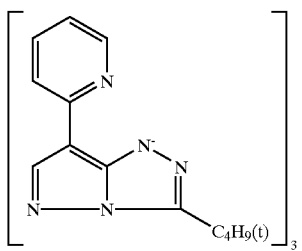
III-6
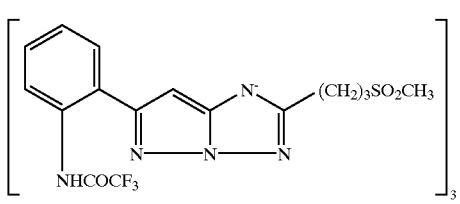
III-7
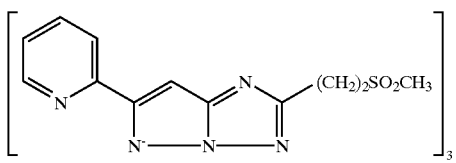
III-8
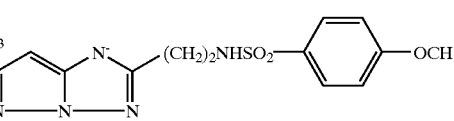
III-9
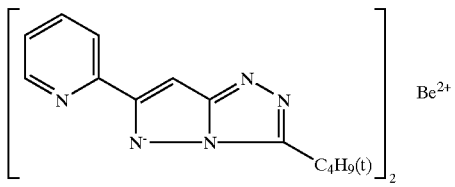
III-10
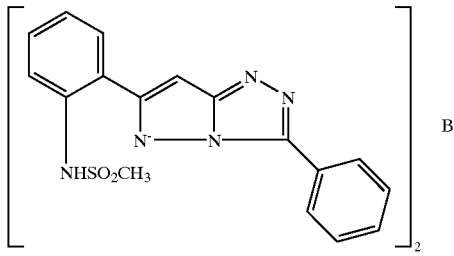
III-11
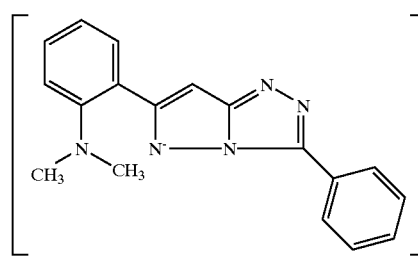
III-12
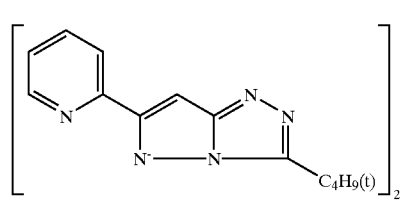
III-13
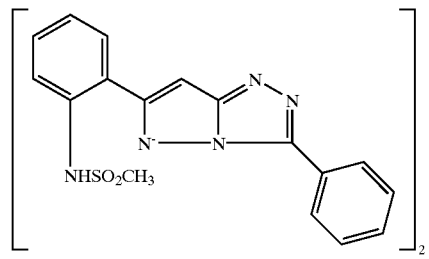
III-14
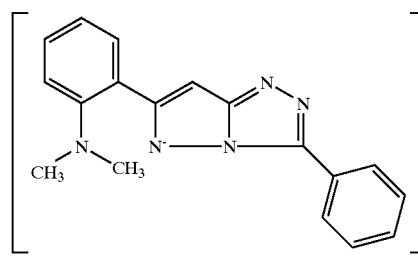
III-15
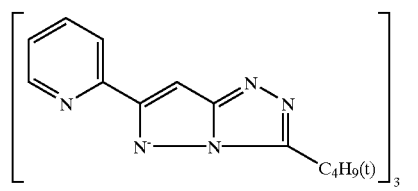
III-16
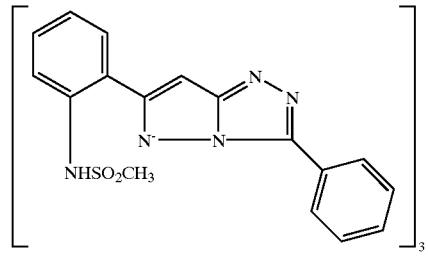

III-17 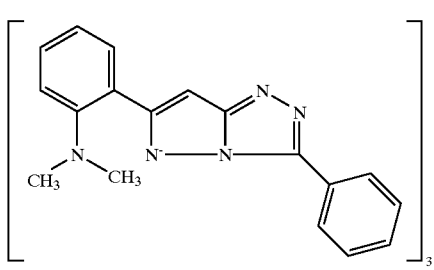
III-18 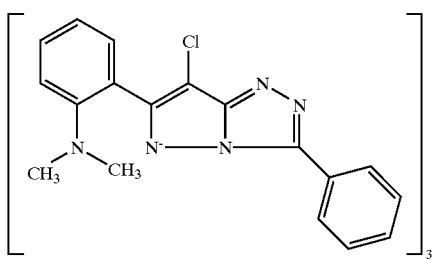
III-19 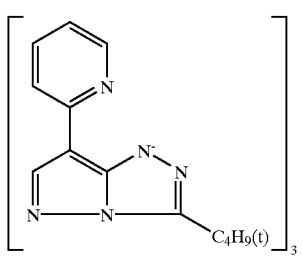
III-20 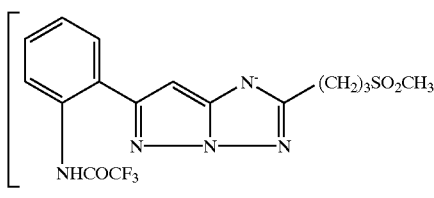
IV-1 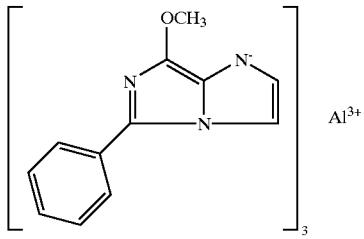
IV-2 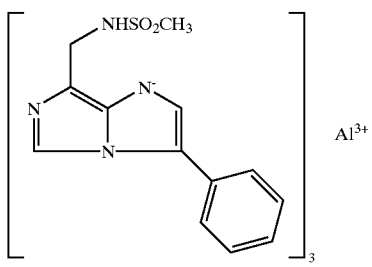
IV-3 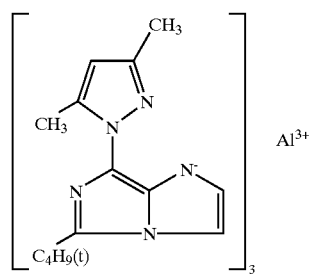
IV-4 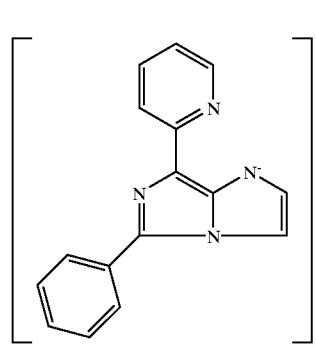
IV-5 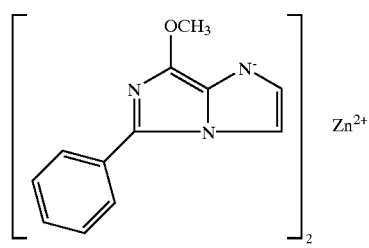
IV-6 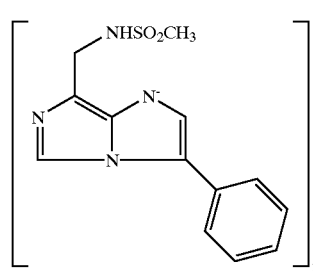
IV-7 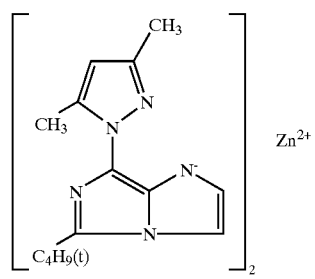

IV-8 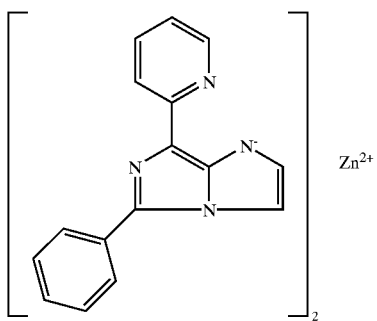
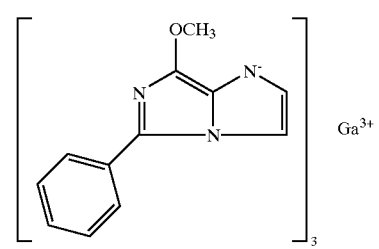 IV-13
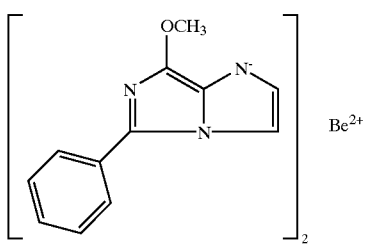
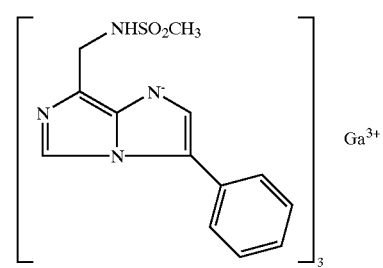 IV-14
IV-9 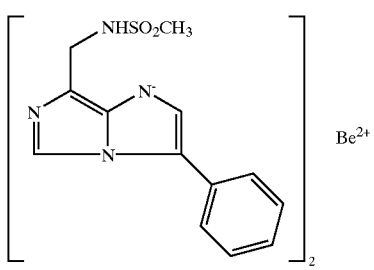
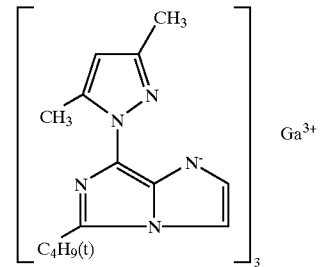 IV-15
IV-10
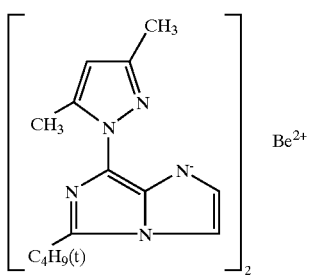
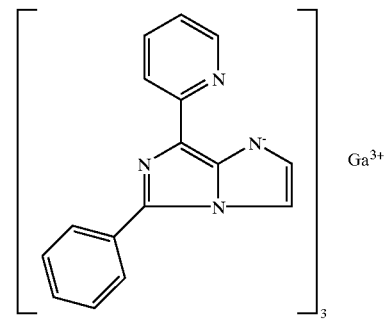 IV-16
IV-11
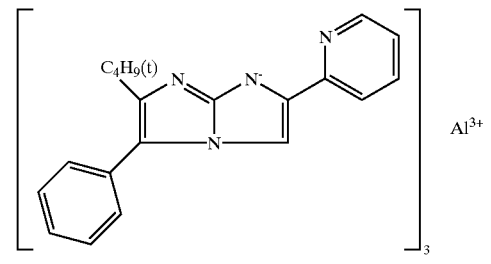 V-1
IV-12 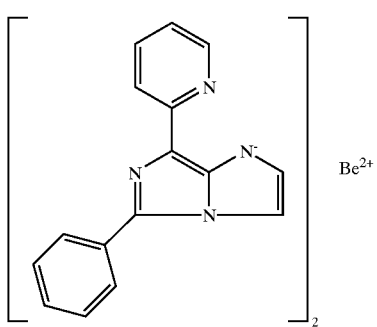
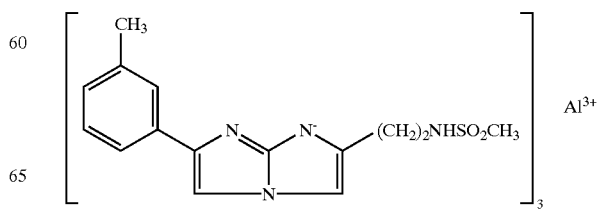 V-2

V-3 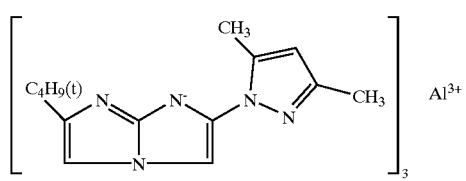
V-4 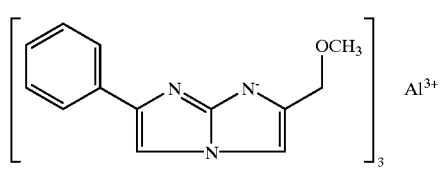
V-5 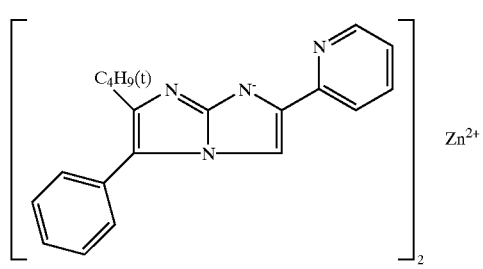
V-6 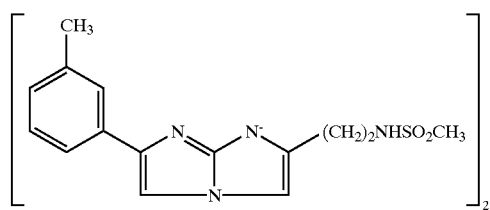
V-7 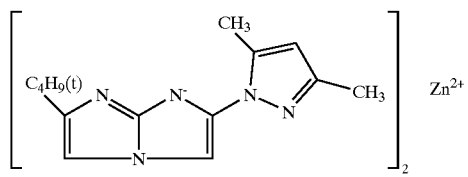
V-8 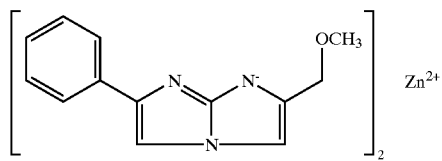
V-9 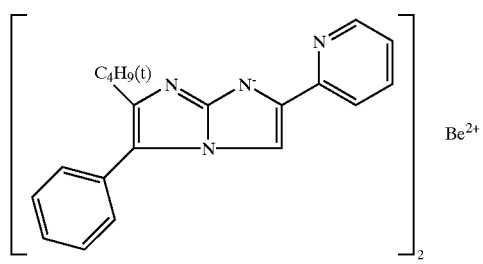
V-10 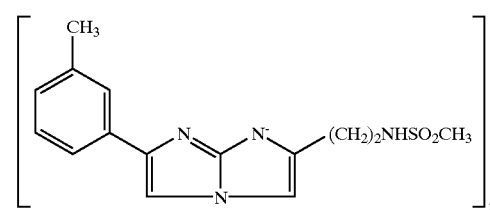
V-11 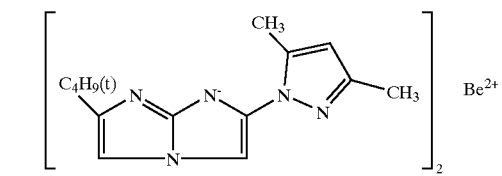
V-12 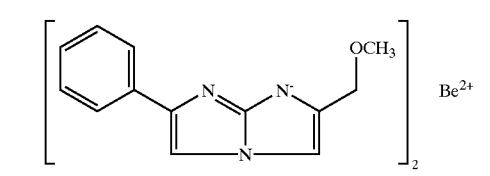
V-13 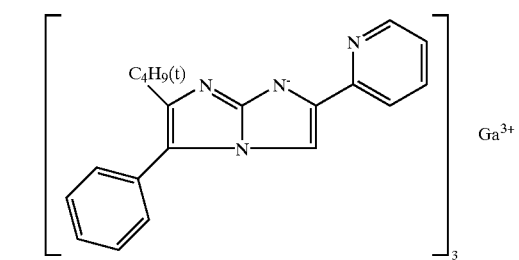
V-14 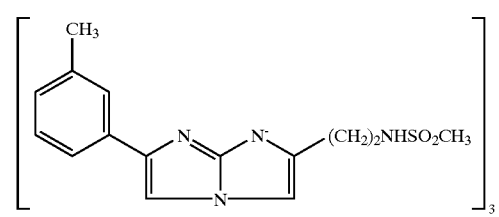
V-15 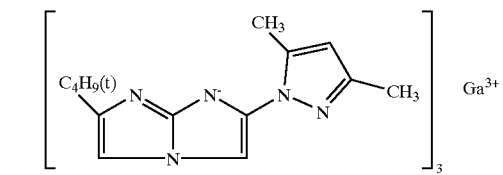
V-16 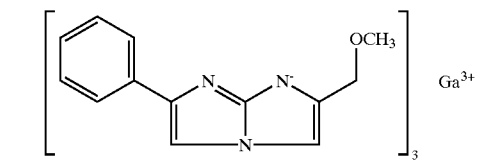

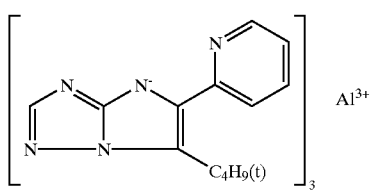 VI-1
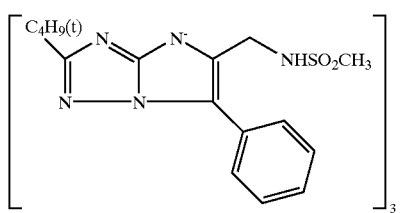 VI-2
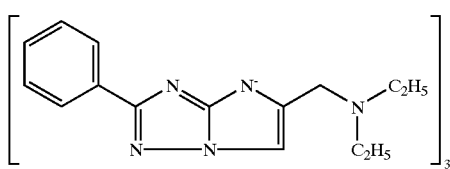 VI-3
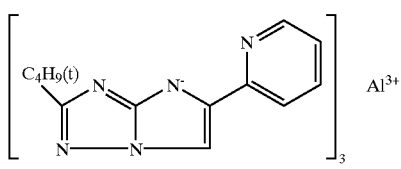 VI-4
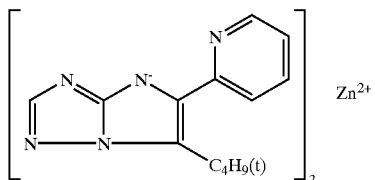 VI-5
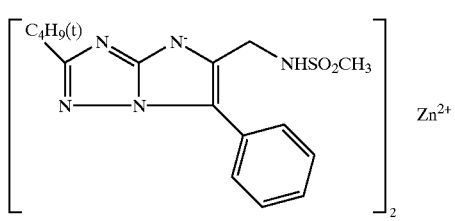 VI-6
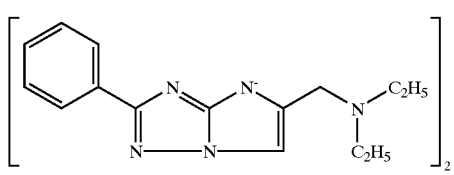 VI-7
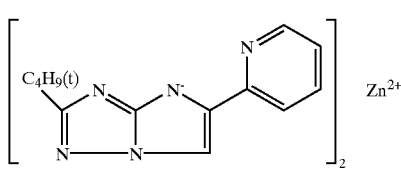 VI-8
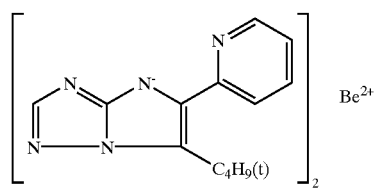 VI-9
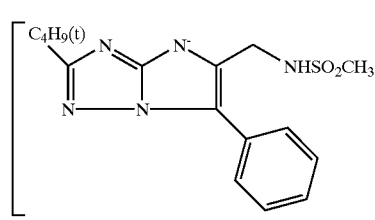 VI-10
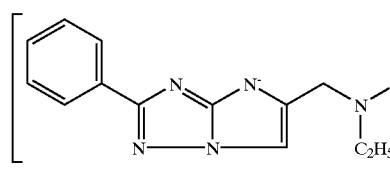 VI-11
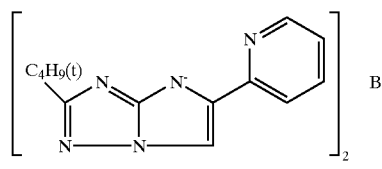 VI-12
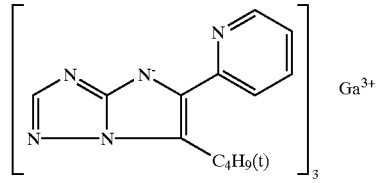 VI-13
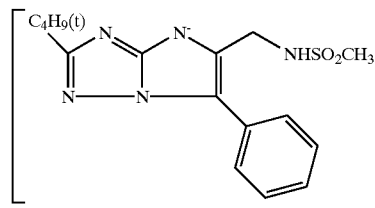 VI-14
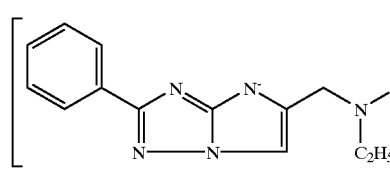 VI-15
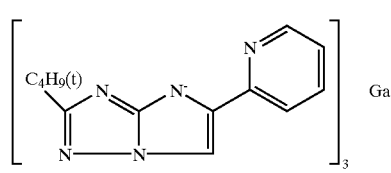 VI-16

VII-1 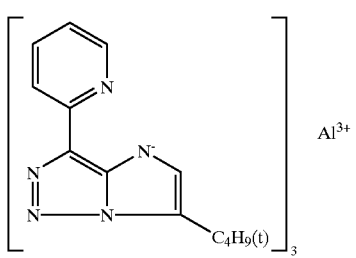
VII-2 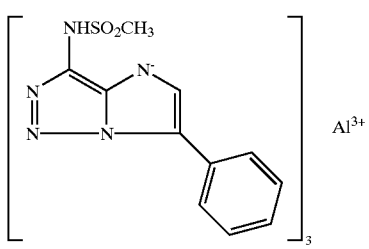
VII-3 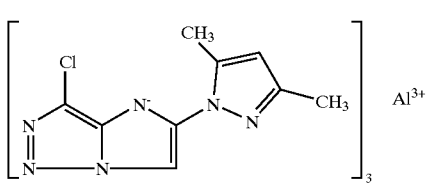
VII-4 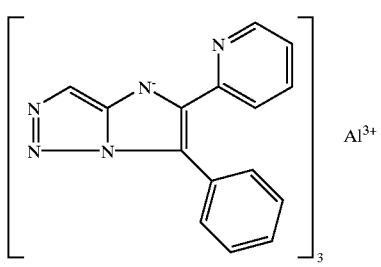
VII-5 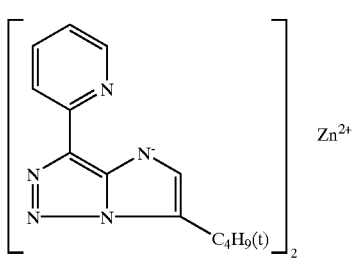
VII-6 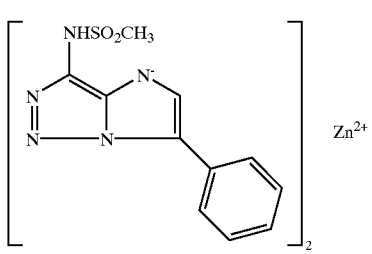
VII-7 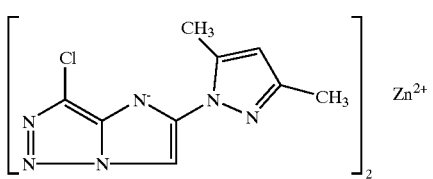
VII-8 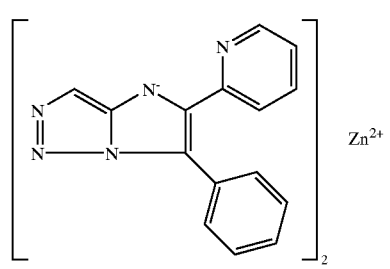
VII-9 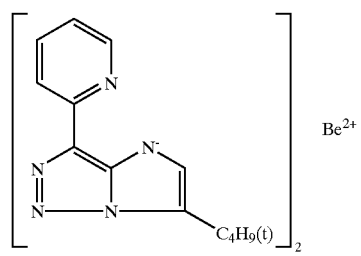
VII-10 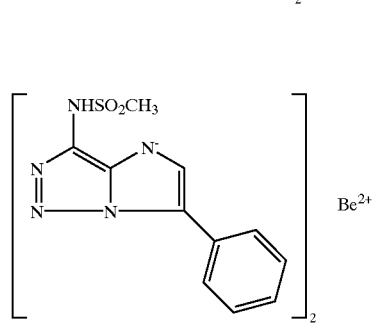
VII-11 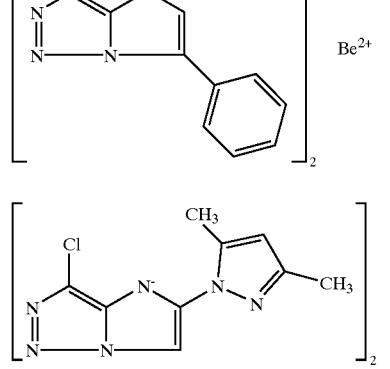
VII-12 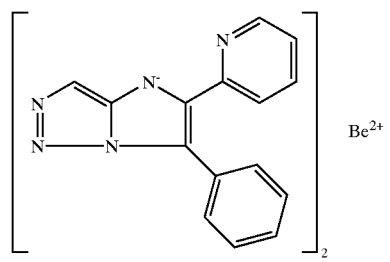
VII-13 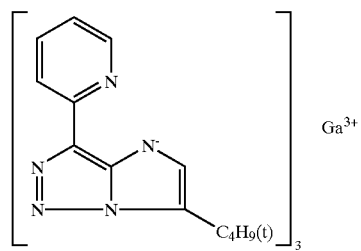

VII-14 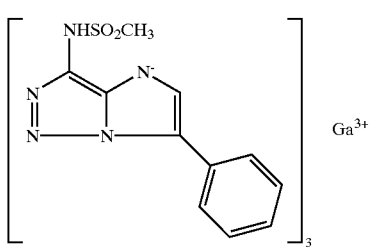
VII-15 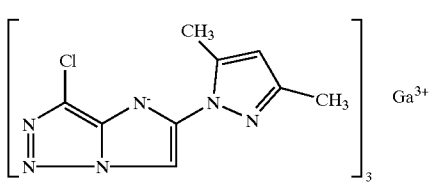
VII-16 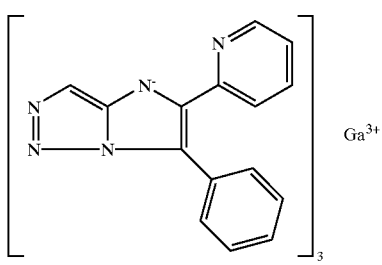
VIII-1 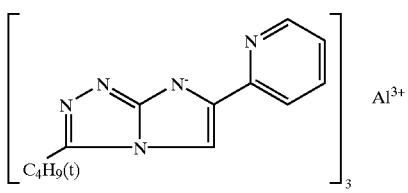
VIII-2 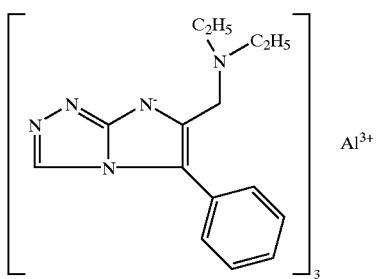
VIII-3 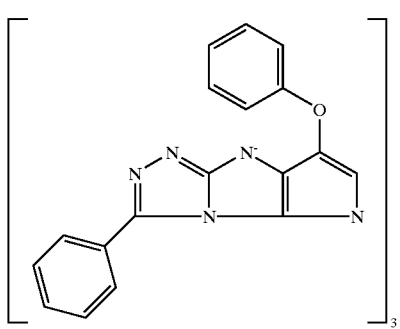
VIII-4 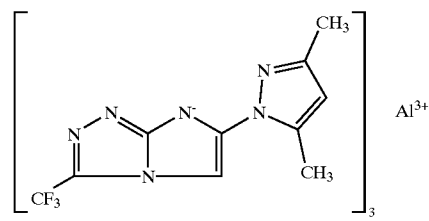
VIII-5 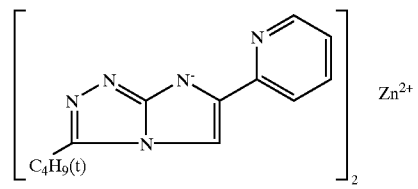
VIII-6 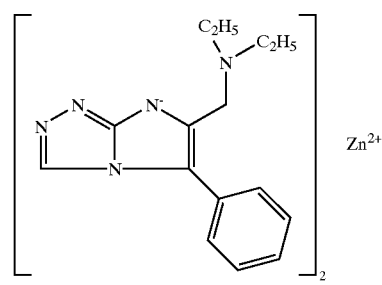
VIII-7 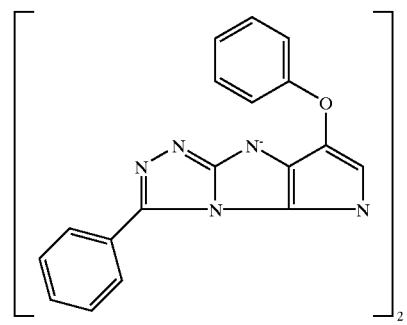
VIII-8 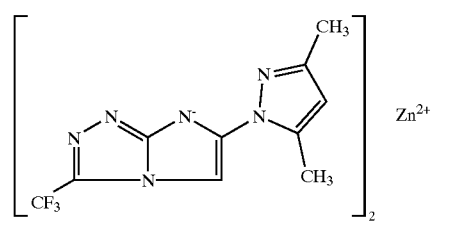
VIII-9 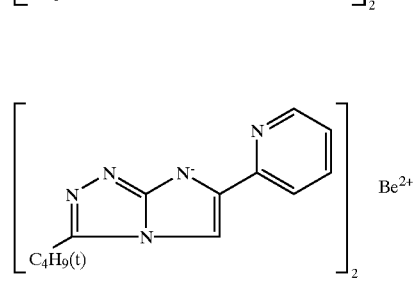

VIII-10
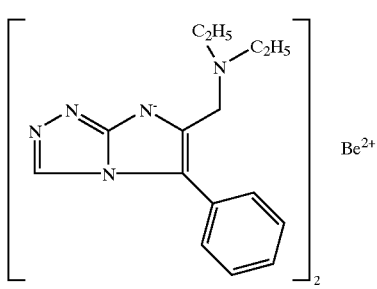
VIII-11
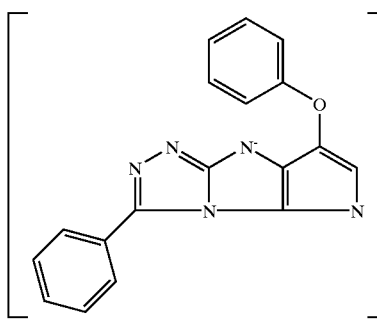
VIII-12
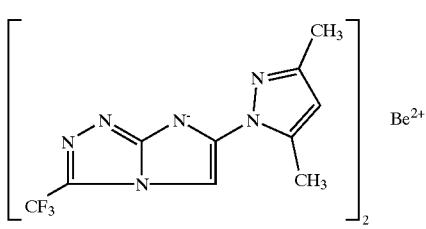
VIII-13
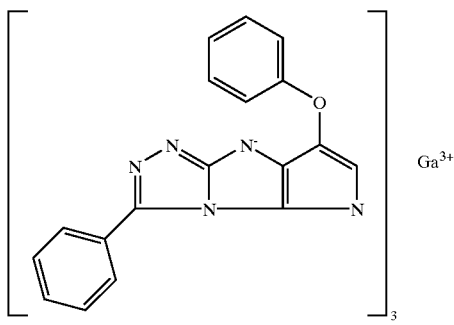
VIII-14
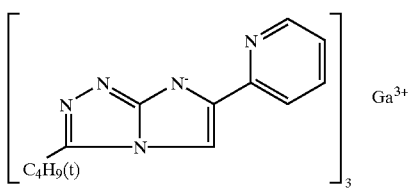
IX-1
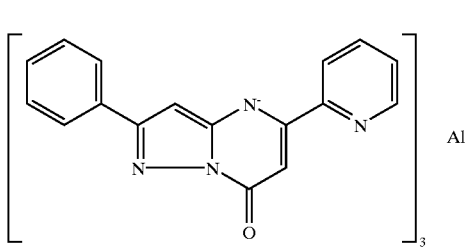
IX-2
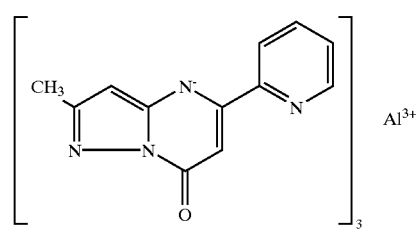
IX-3
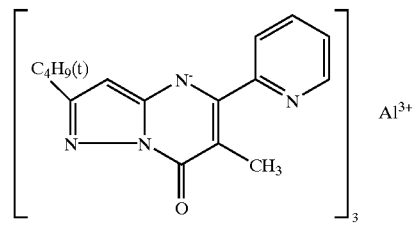
IX-4
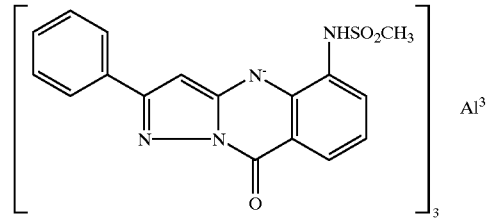
IX-5
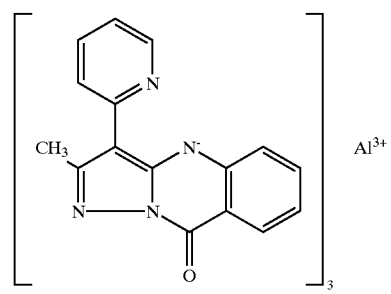
IX-6
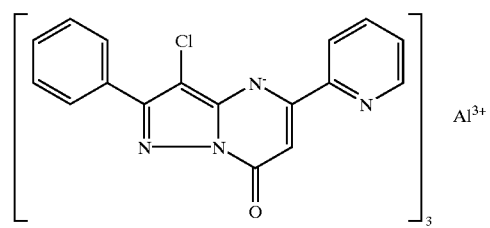
IX-7
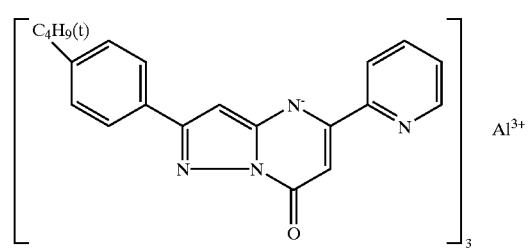

IX-8
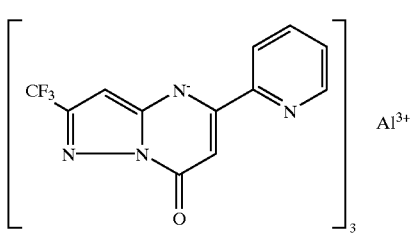 Al³⁺
IX-9
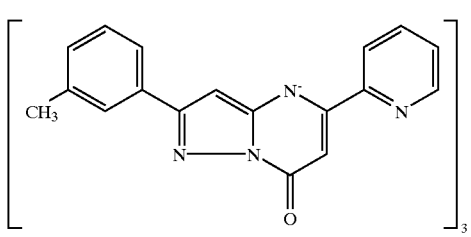 Al³⁺
IX-10
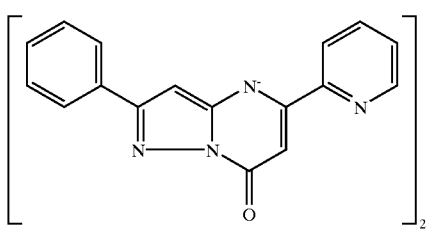 Zn²⁺
IX-11
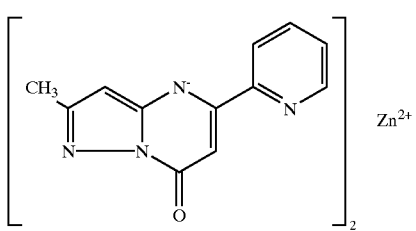 Zn²⁺
IX-12
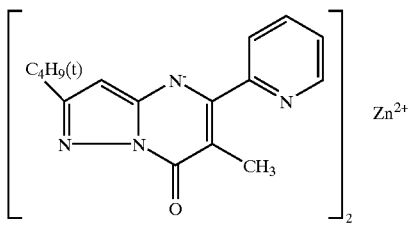 Zn²⁺
IX-13
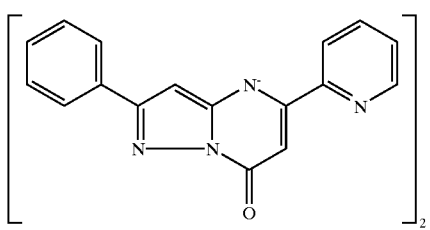 Be²⁺
IX-14
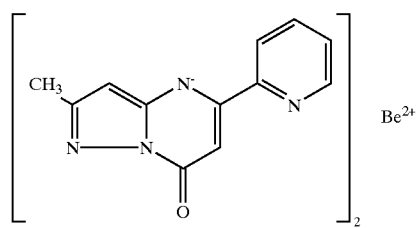 Be²⁺
IX-15
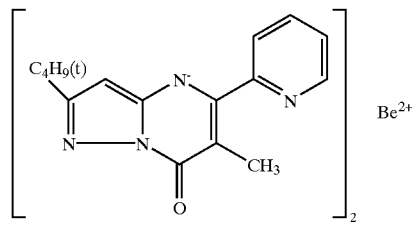 Be²⁺
IX-16
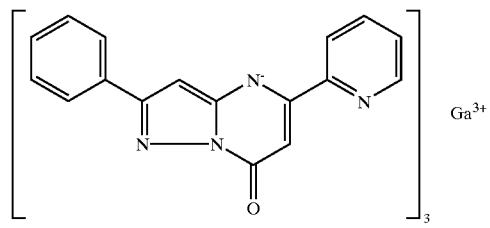 Ga³⁺
IX-17
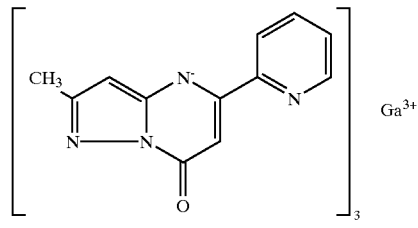 Ga³⁺
IX-18
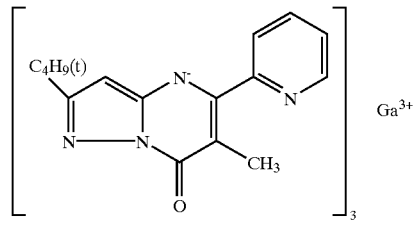 Ga³⁺
IX-19
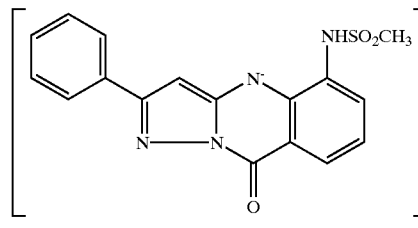 Ga³⁺

-continued
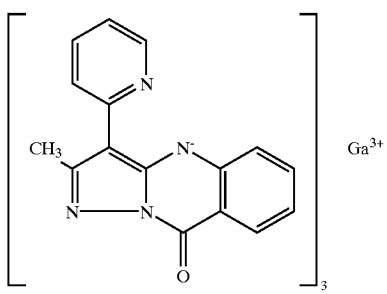 IX-20
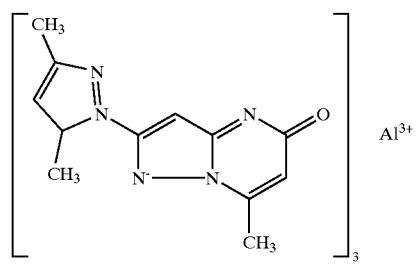 X-5
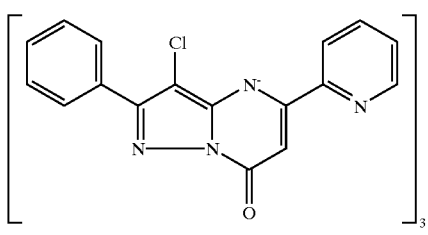 IX-21
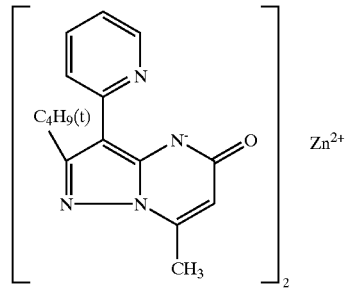 X-6
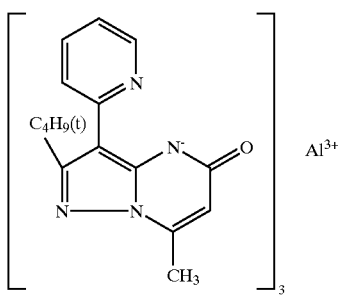 X-1
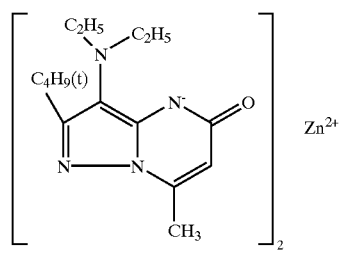 X-7
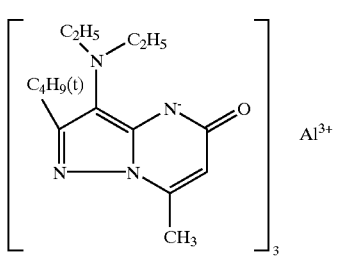 X-2
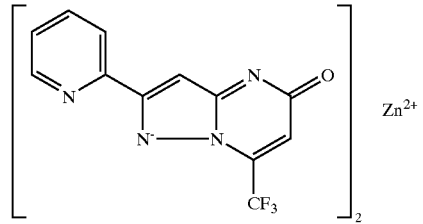 X-8
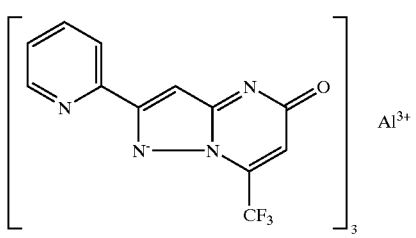 X-3
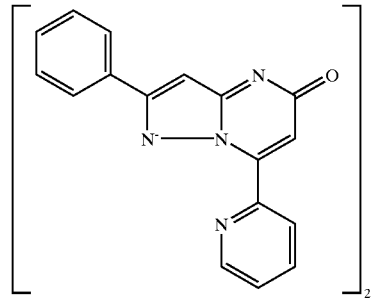 X-9
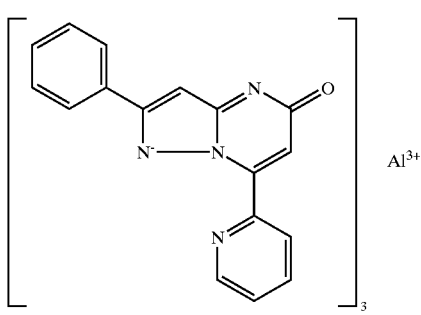 X-4
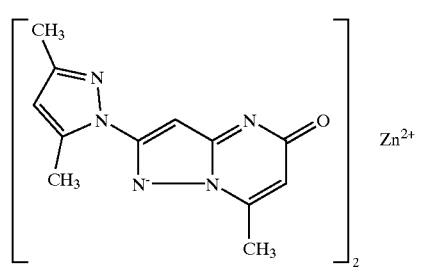 X-10

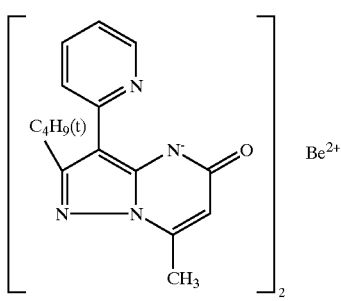
X-11
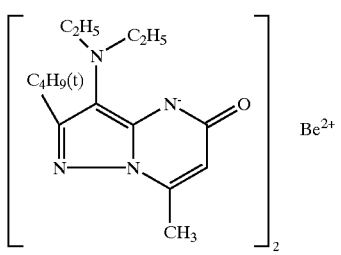
X-12
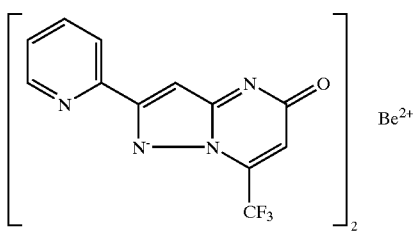
X-13
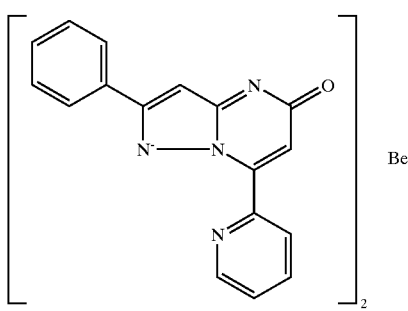
X-14
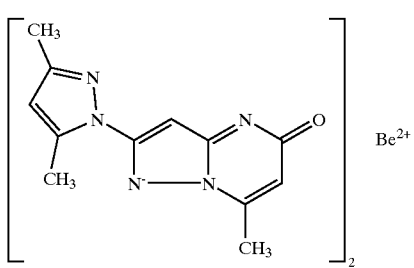
X-15
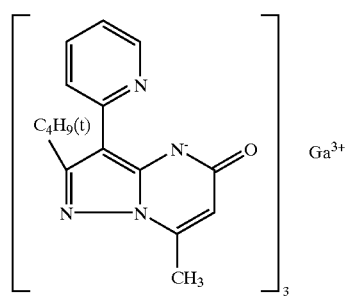
X-16
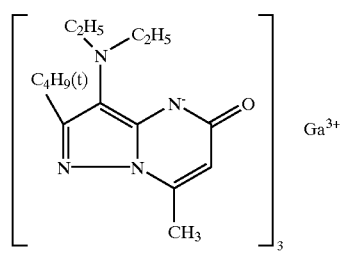
X-17
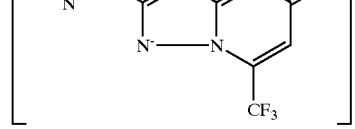
X-18
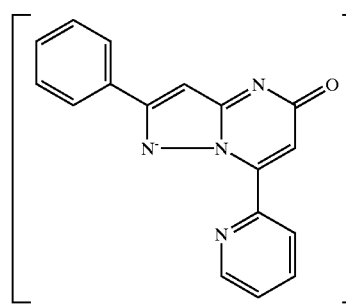
X-19
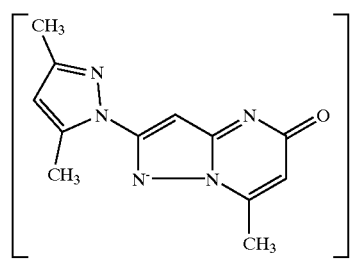
X-20
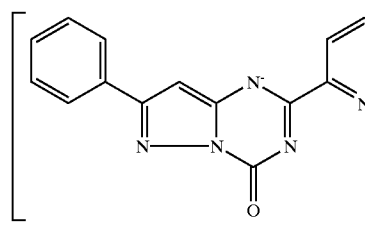
XI-1

XI-2 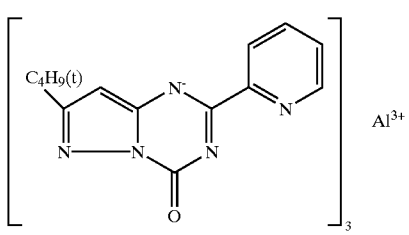
XI-8 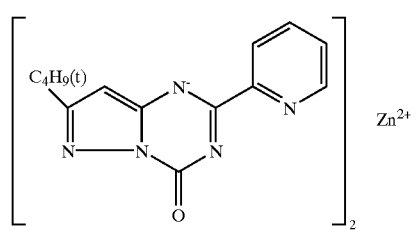
XI-3 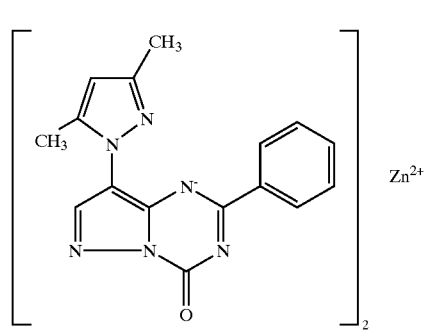 (upper left)
XI-9 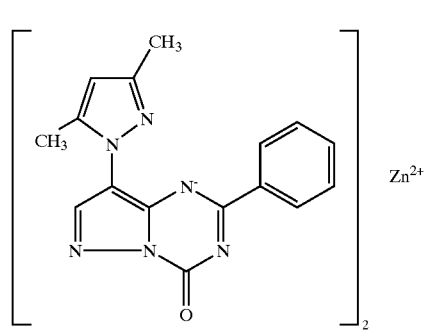
XI-4 
XI-10 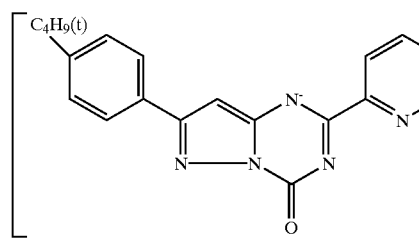
XI-5
XI-11 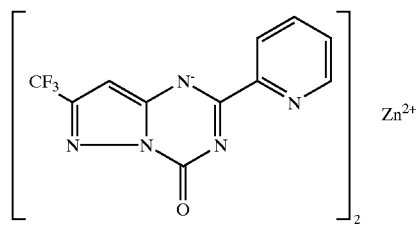
XI-6
XI-12 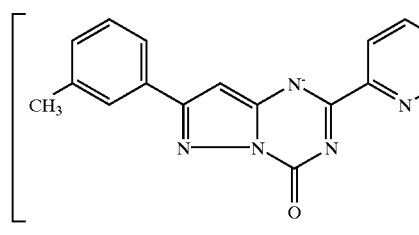
XI-7
XI-13 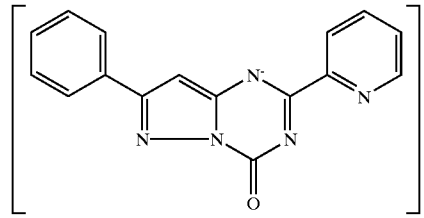

XI-14 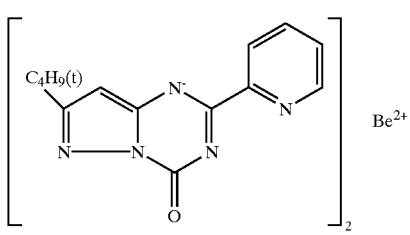
XI-20 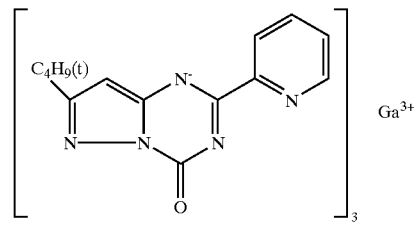
XI-15 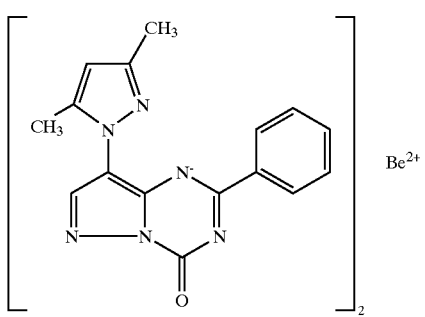
XI-21 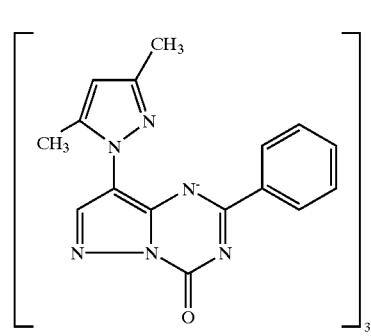
XI-16 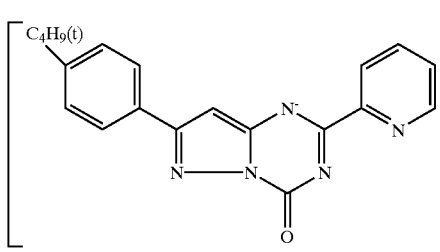
XI-22 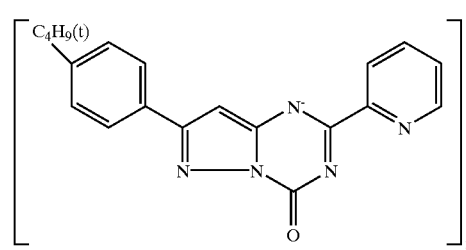
XI-17 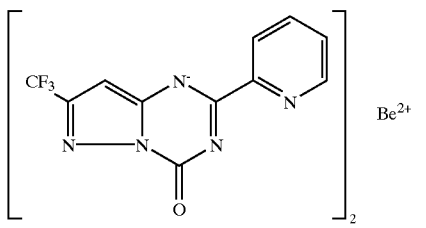
XI-23 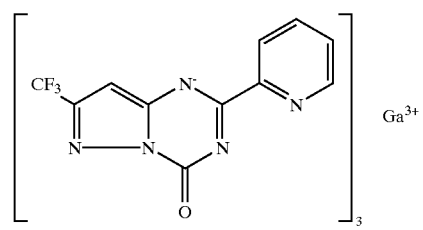
XI-18 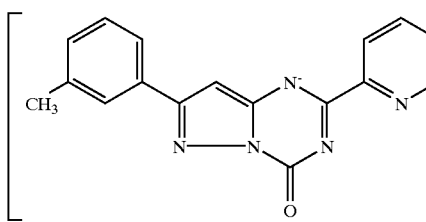
XI-24 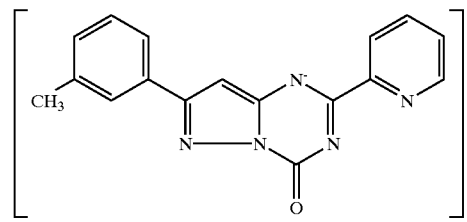
XI-19 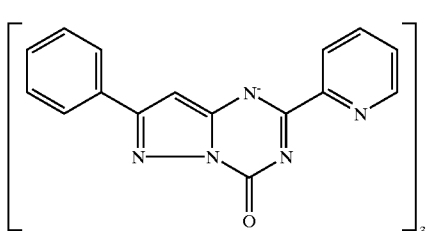
XII-1 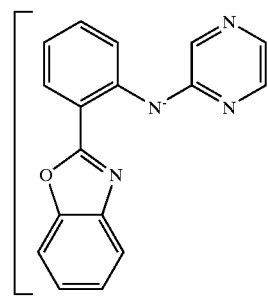

-continued
XII-2
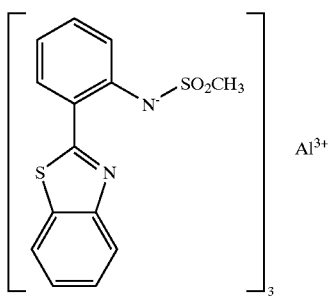
XII-3
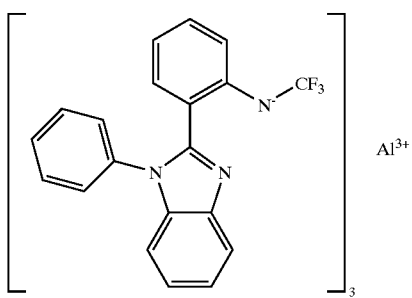
XII-4
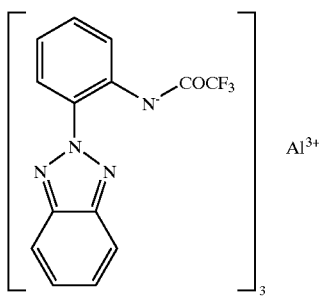
XII-5
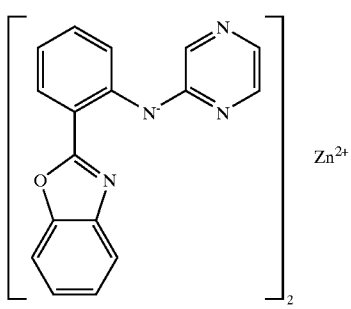
XII-6
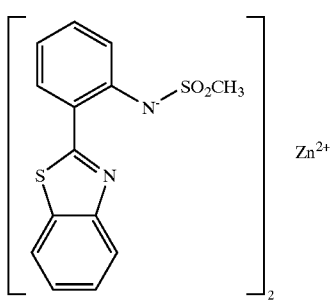
XII-7
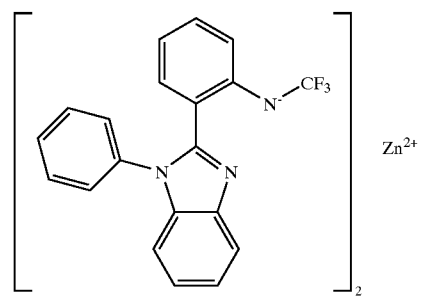
XII-8
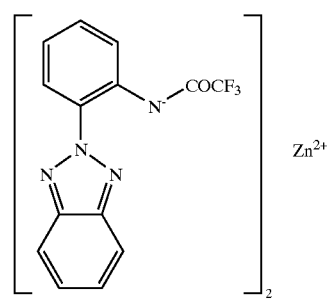
XII-9
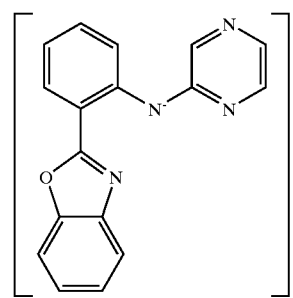
XII-10
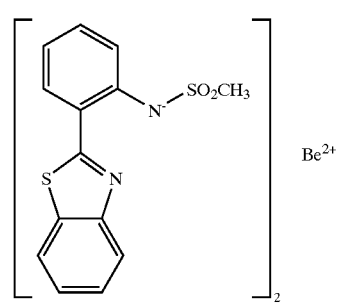
XII-11
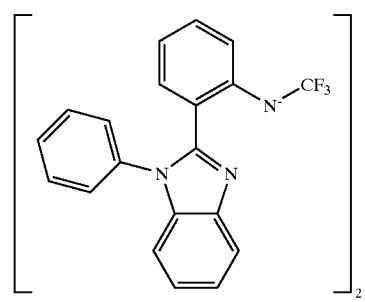

-continued
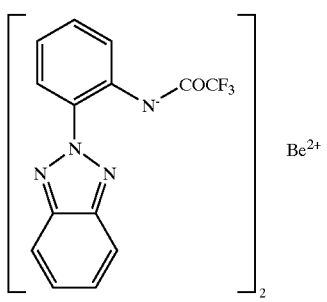
XII-12
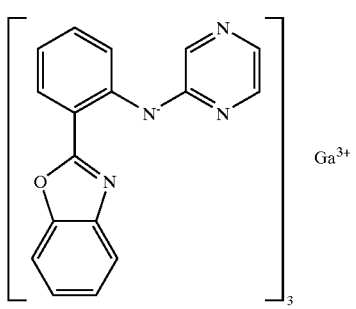
XII-13
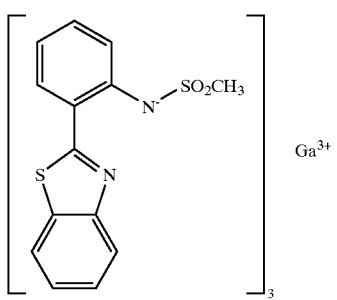
XII-14
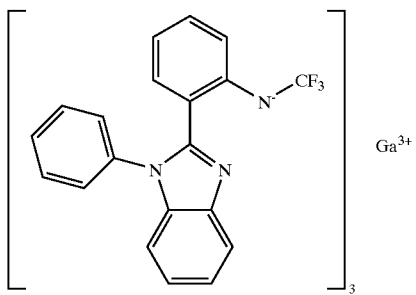
XII-15
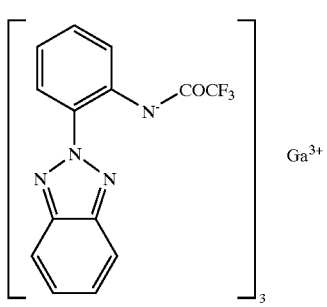
XII-16
-continued
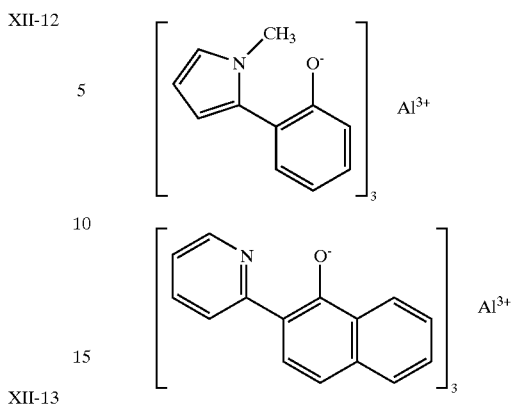
XIII-1
XIII-2
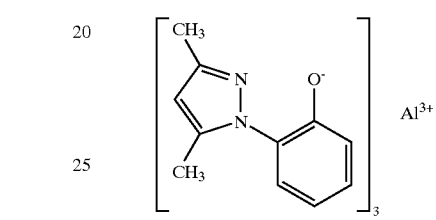
XIII-3
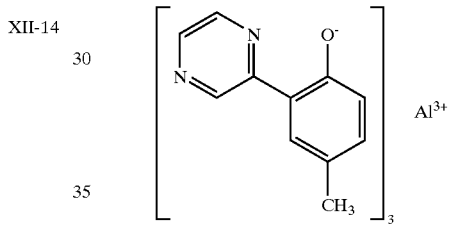
XIII-4
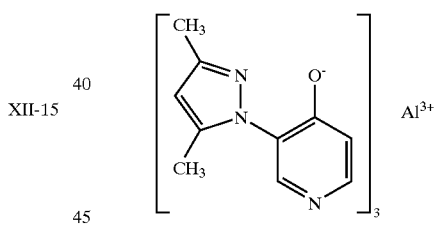
XIII-5
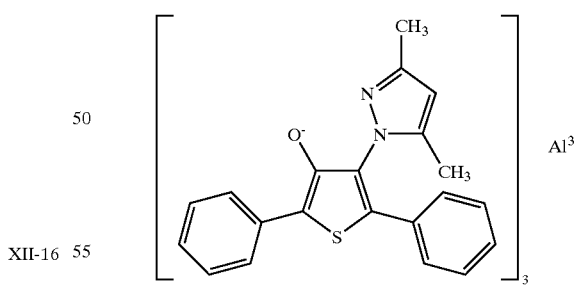
XIII-6
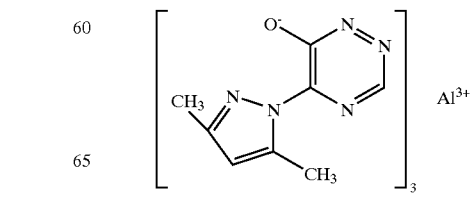
XIII-7

XIII-8
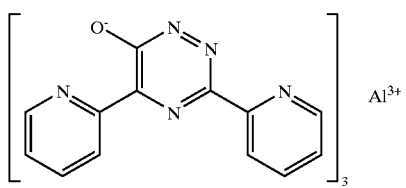
XIII-9
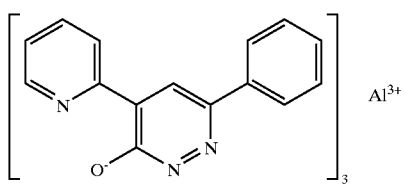
XIII-10
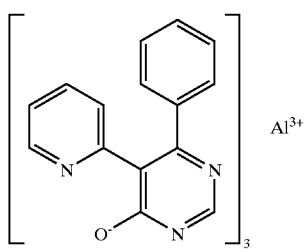
XIII-11
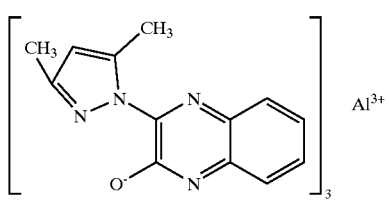
XIII-12
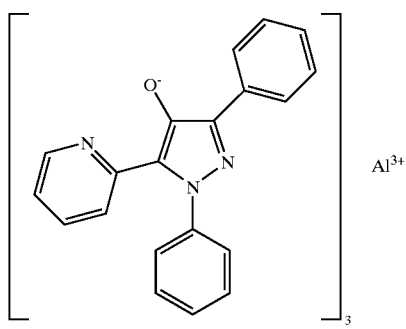
XIII-13
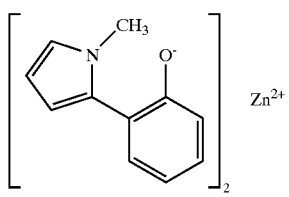
XIII-14
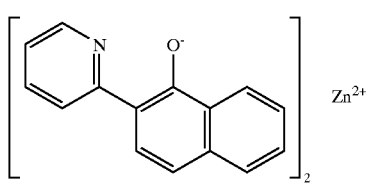
XIII-15
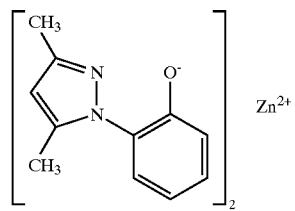
XIII-16
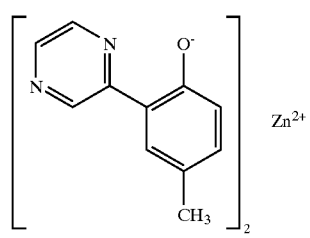
XIII-17
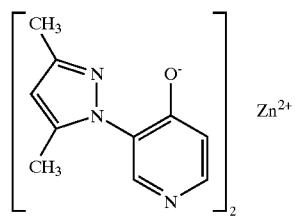
XIII-18
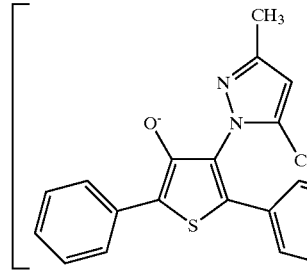
XIII-19
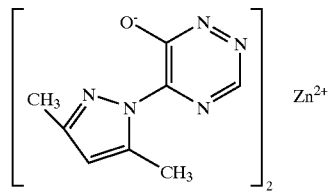
XIII-20
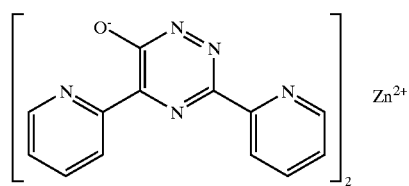
XIII-21
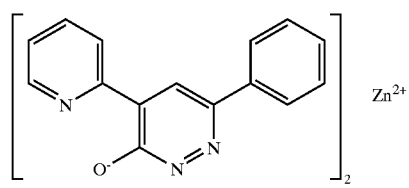

XIII-22 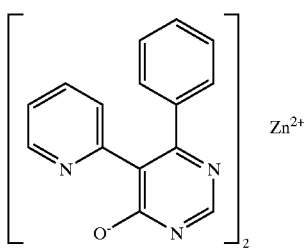
XIII-23 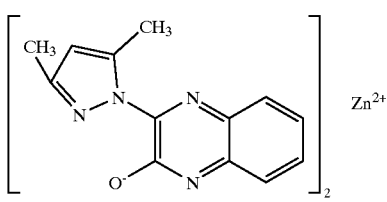
XIII-24 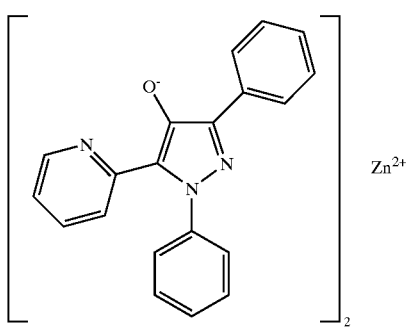
XIII-25 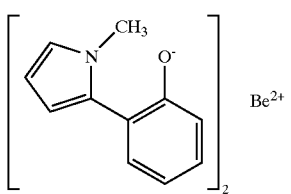
XIII-26 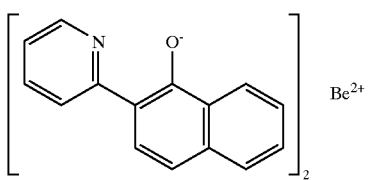
XIII-27 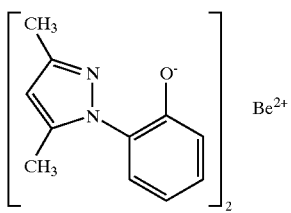
XIII-28 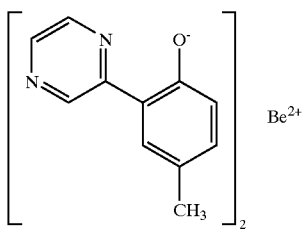
XIII-29 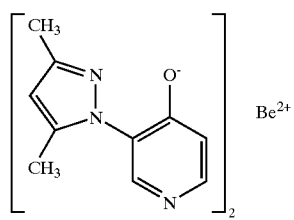
XIII-30 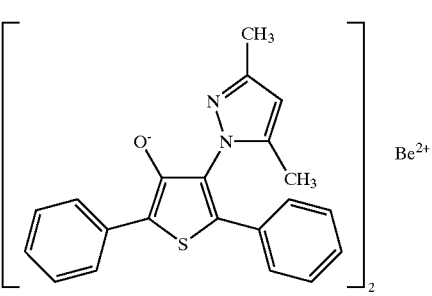
XIII-31 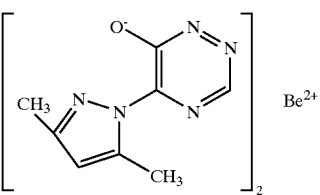
XIII-32 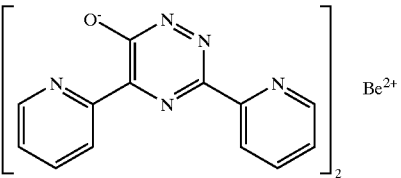
XIII-33 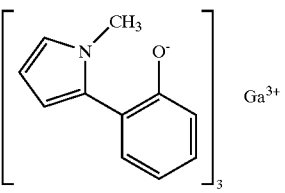
XIII-34 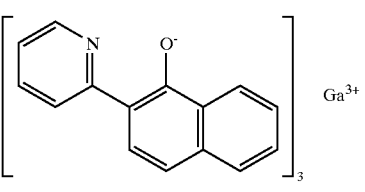
XIII-35 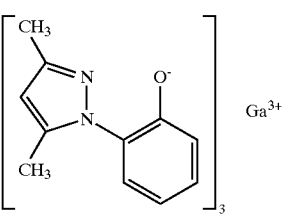

XIII-36 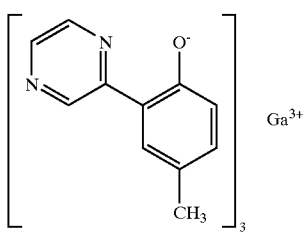
XIII-37 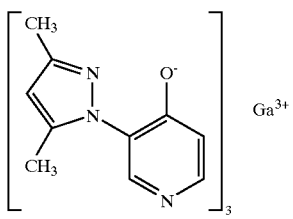
XIII-38 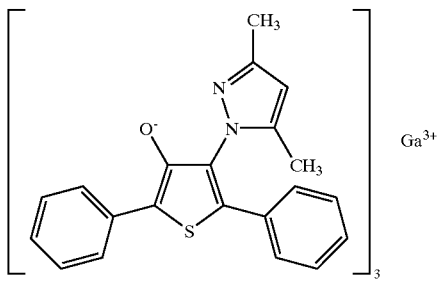
XIII-39 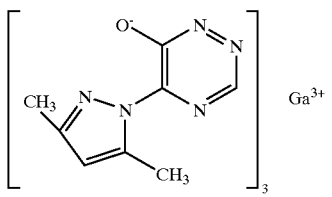
XIII-40 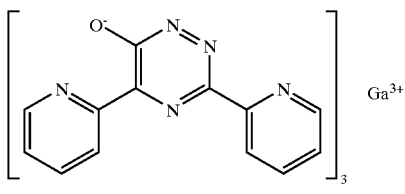
XIII-41 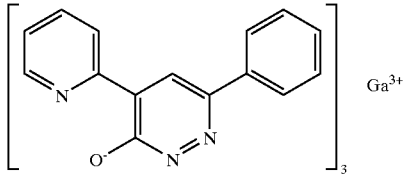
XIII-42 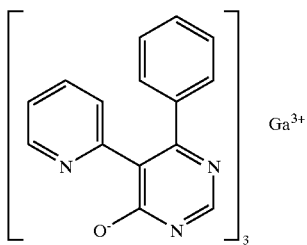
XIII-43 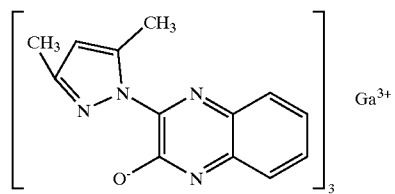
XIII-44 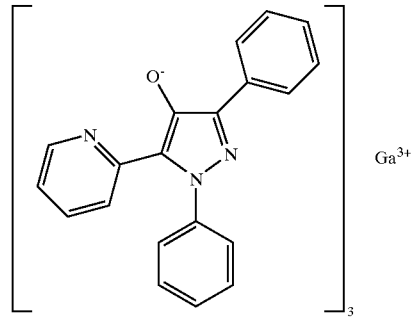
XIV-1 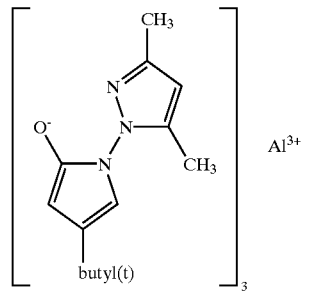
XIV-2 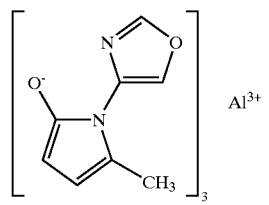
XIV-3 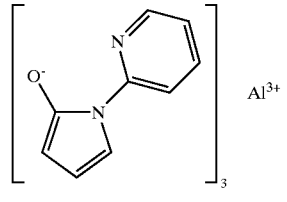
XIV-4 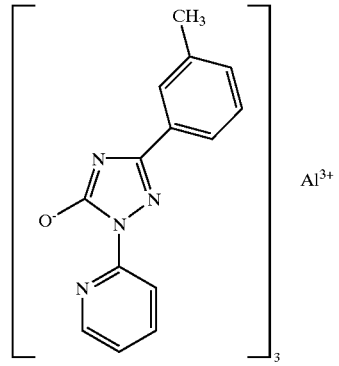

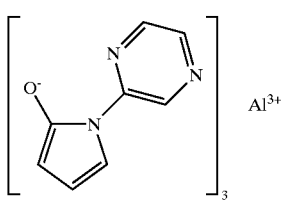
XIV-5
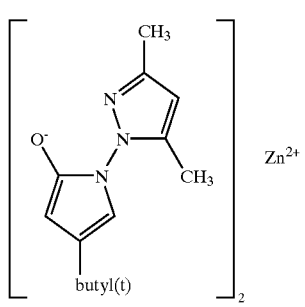
XIV-11
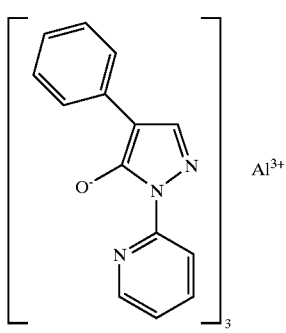
XIV-6
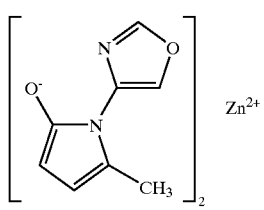
XIV-12
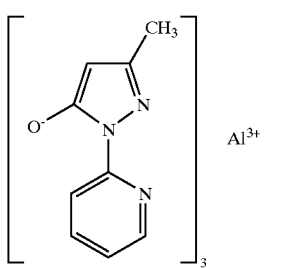
XIV-7
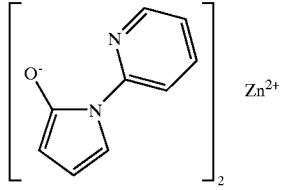
XIV-13
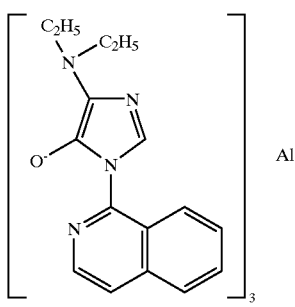
XIV-8
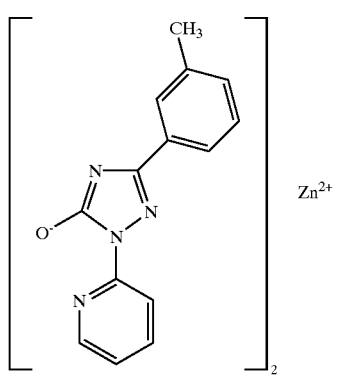
XIV-14
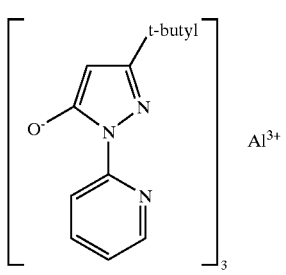
XIV-9
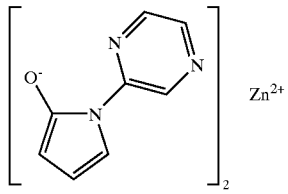
XIV-15
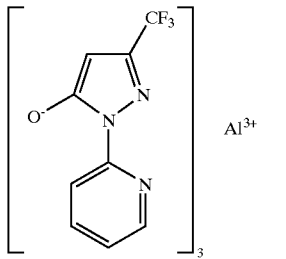
XIV-10
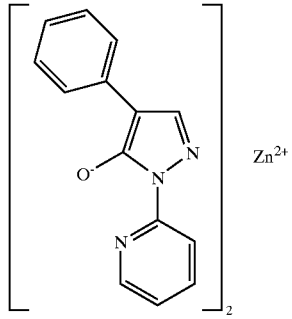
XIV-16

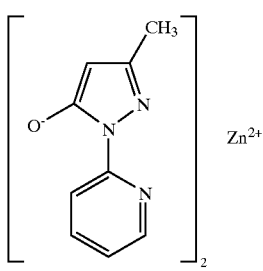
XIV-17
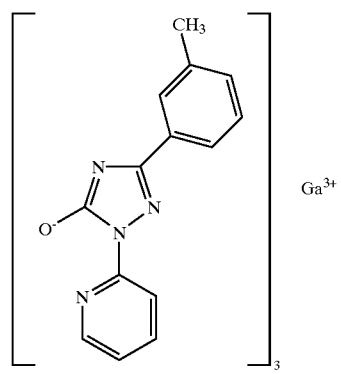
XIV-22
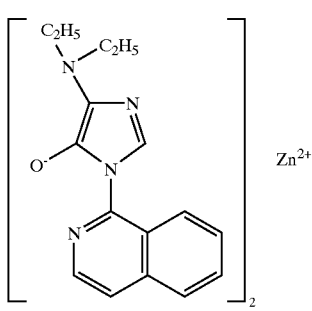
XIV-18
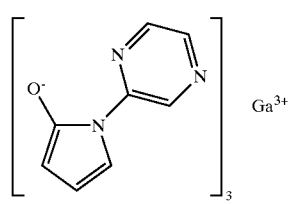
XIV-23
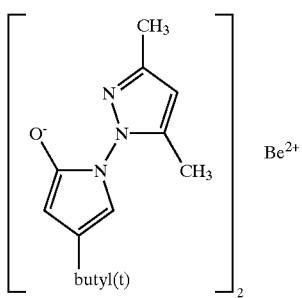
XIV-19
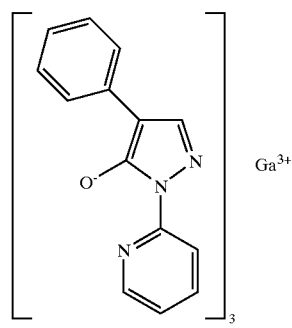
XIV-24
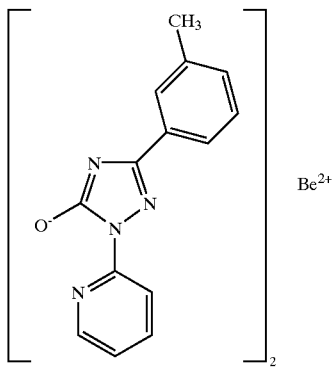
XIV-20
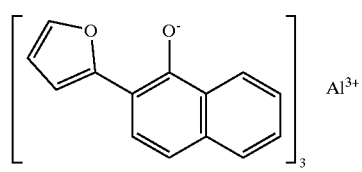
XV-1
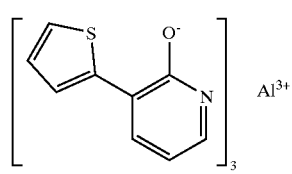
XV-2
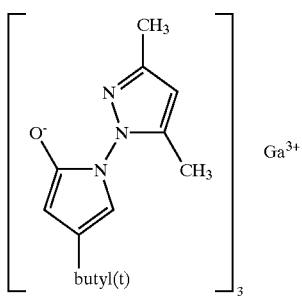
XIV-21
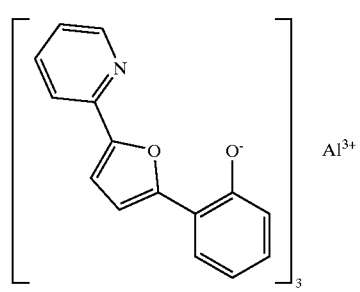
XV-3

XV-4 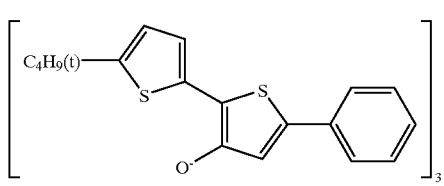 Al³⁺
XV-5 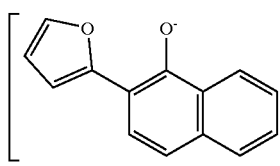 Zn²⁺
XV-6 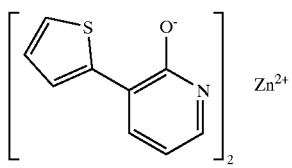 Zn²⁺
XV-7 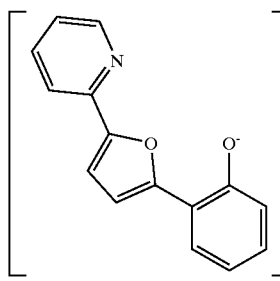 Zn²⁺
XV-8 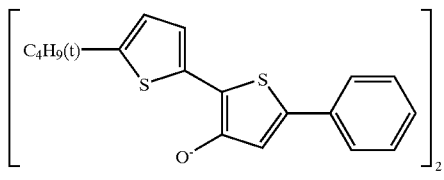 Zn²⁺
XV-9 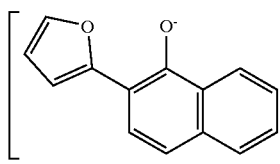 Be²⁺
XV-10 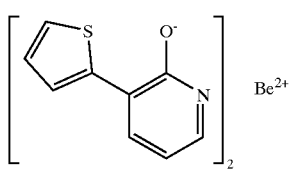 Be²⁺
XV-11 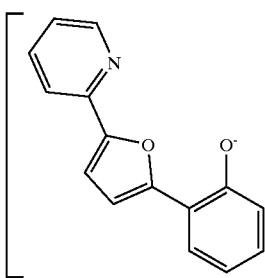 Be²⁺
XV-12 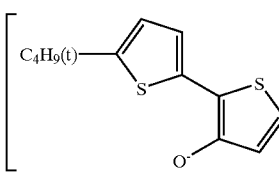 Be²⁺
XV-13 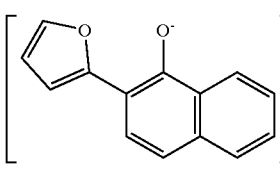 Ga³⁺
XV-14 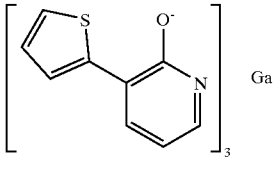 Ga³⁺
XV-15 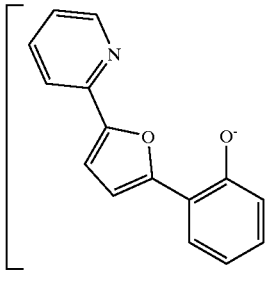 Ga³⁺
XV-16 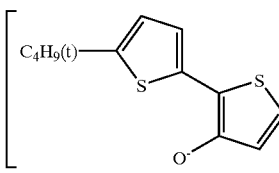 Ga³⁺
XVI-1 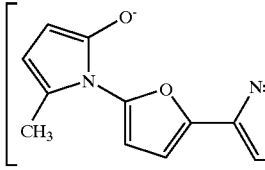 Al³⁺

XVI-2 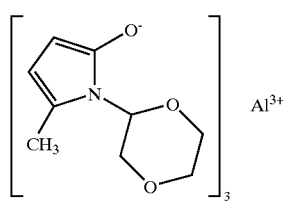
XVI-3 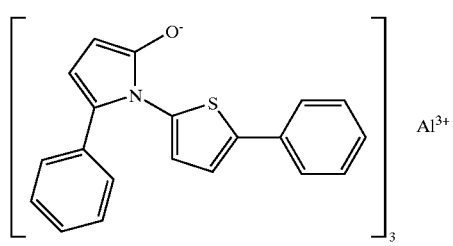
XVI-4 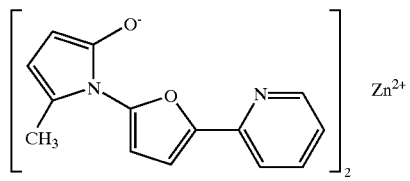
XVI-5 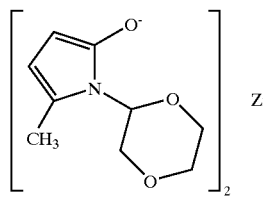
XVI-6 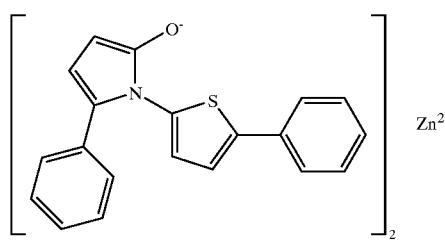
XVI-7 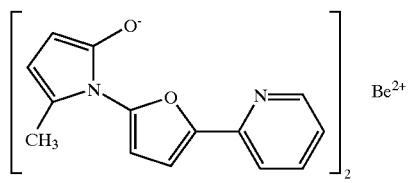
XVI-8 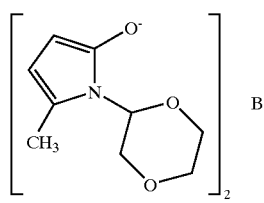
XVI-9 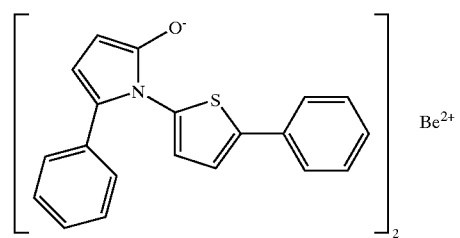
XVI-10 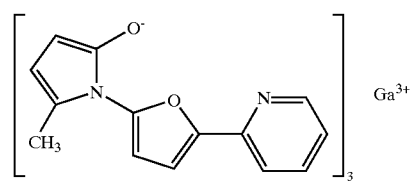
XVI-11 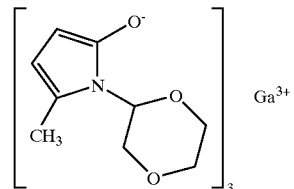
XVI-12 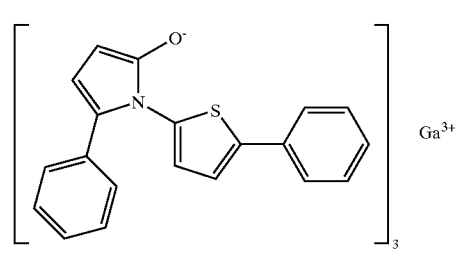
XVII-1 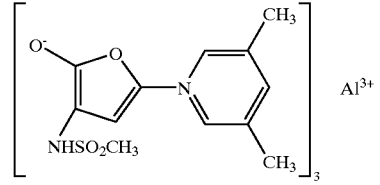
XVII-2 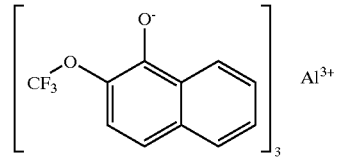
XVII-3 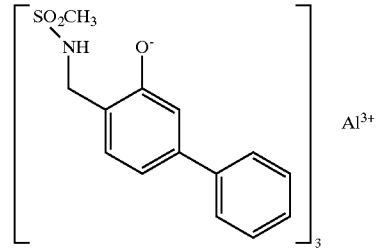

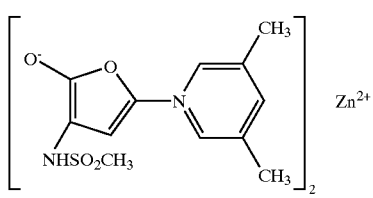
XVII-4
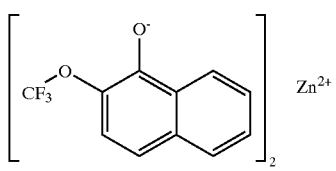
XVII-5
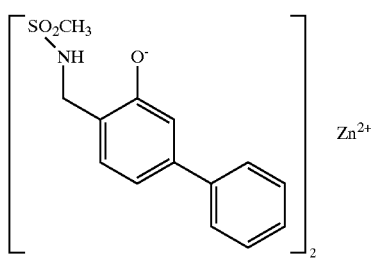
XVII-6
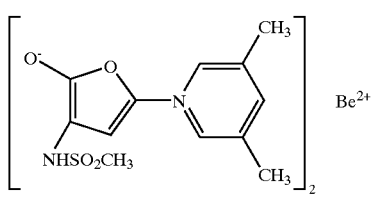
XVII-7
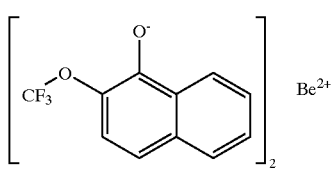
XVII-8
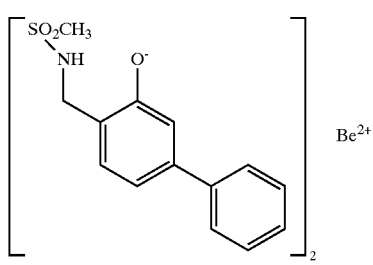
XVII-9
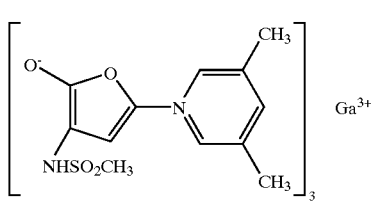
XVII-10
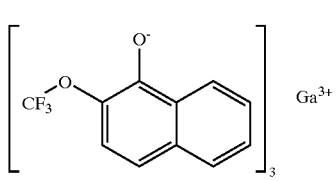
XVII-11
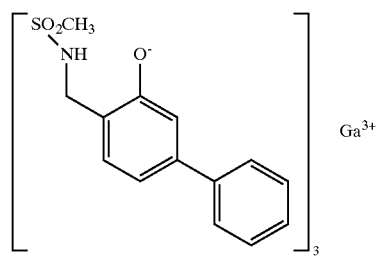
XVII-12
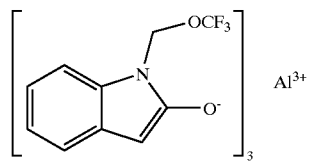
XVIII-1
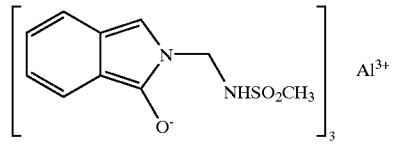
XVIII-2
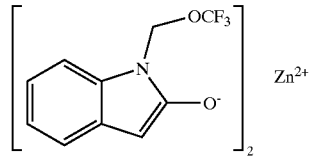
XVIII-3
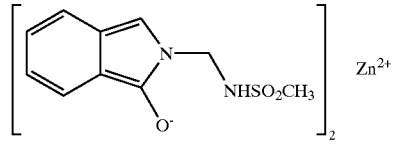
XVIII-4
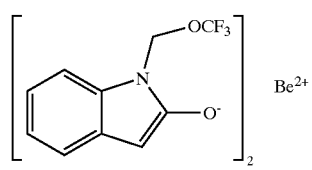
XVIII-5
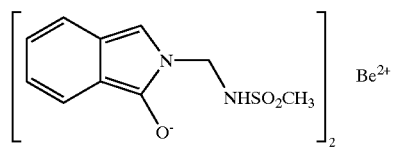
XVIII-6
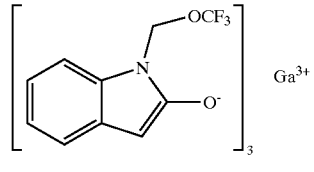
XVIII-7
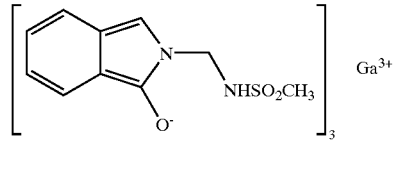
XVIII-8

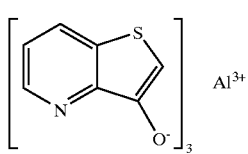 XIX-1
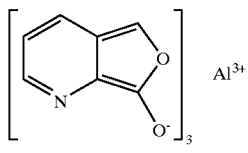 XIX-2
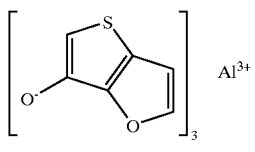 XIX-3
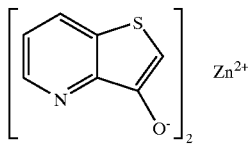 XIX-4
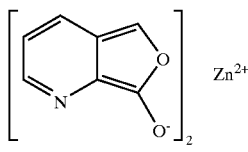 XIX-5
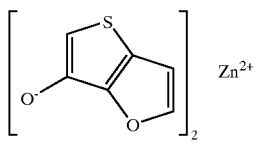 XIX-6
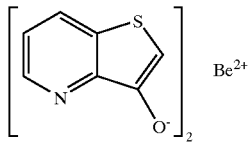 XIX-7
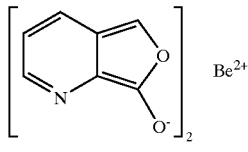 XIX-8
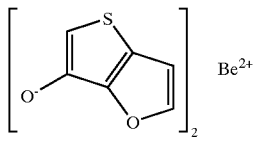 XIX-9
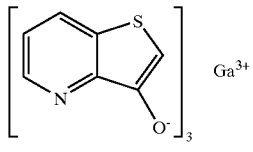 XIX-10
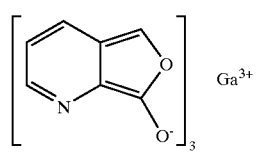 XIX-11
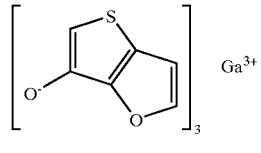 XIX-12
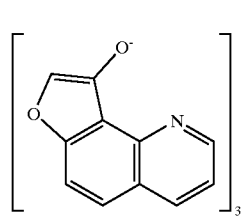 XX-1
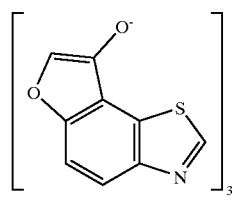 XX-2
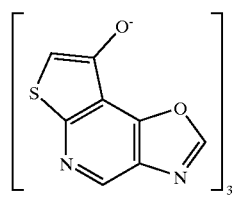 XX-3
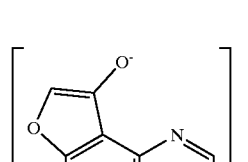 XX-4
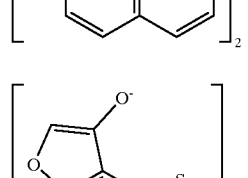 XX-5
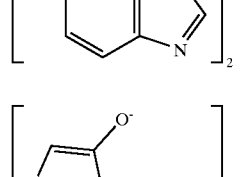 XX-6

XX-7 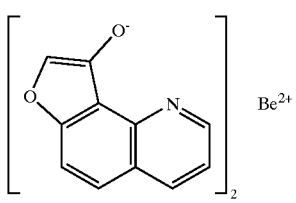
XX-8 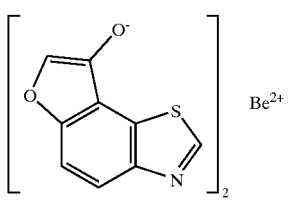
XX-9 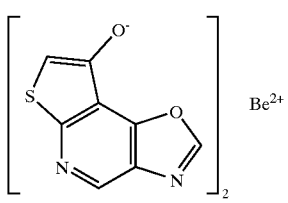
XX-10 
XX-11 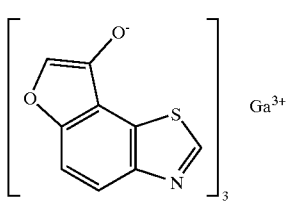
XX-12 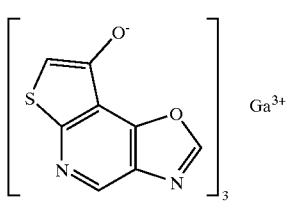
XXI-1 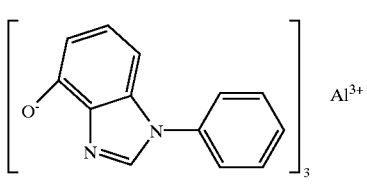
XXI-2 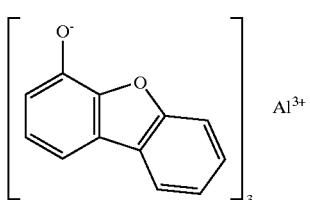
XXI-3 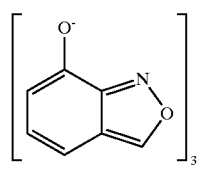
XXI-4 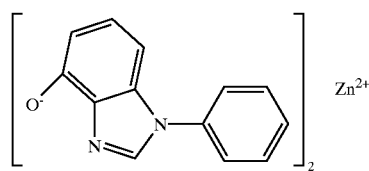
XXI-5 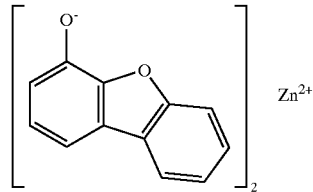
XXI-6 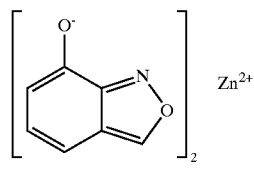
XXI-7 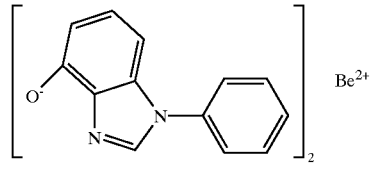
XXI-8 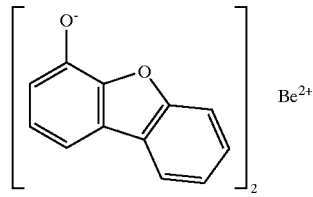
XXI-9 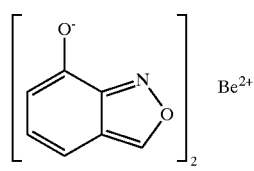
XXI-10 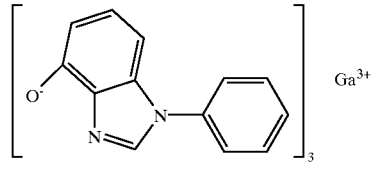

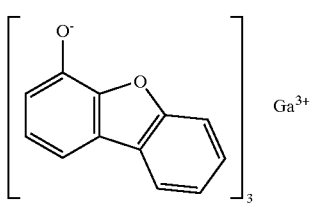
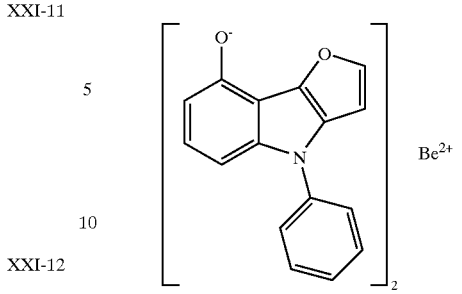
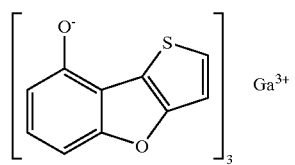
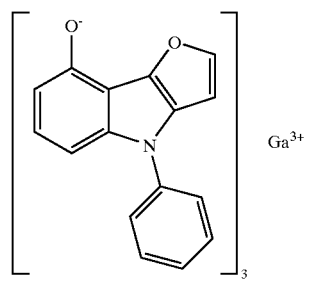
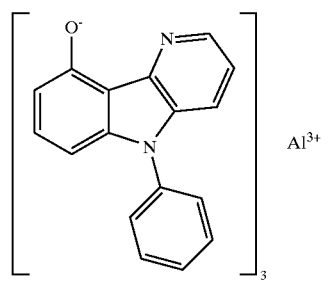
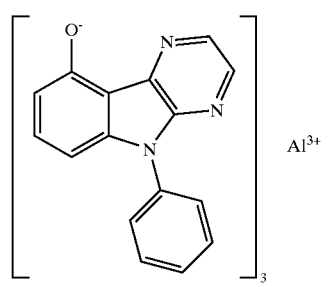
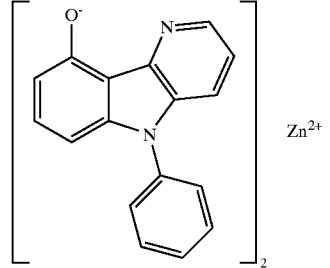

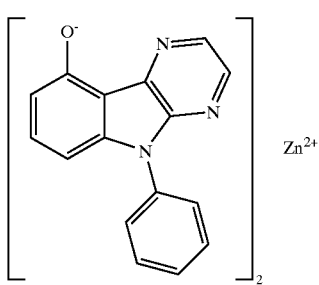 XXIII-4
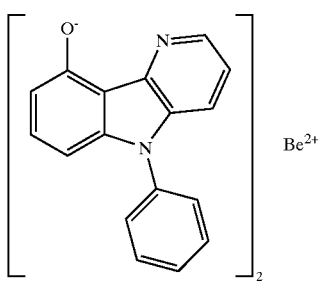 XXIII-5
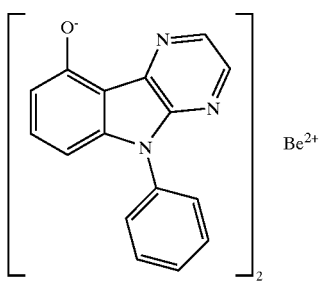 XXIII-6
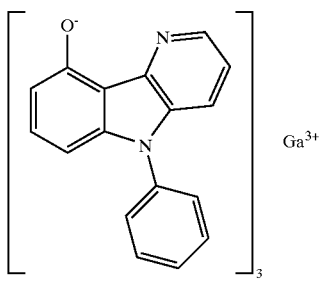 XXIII-7
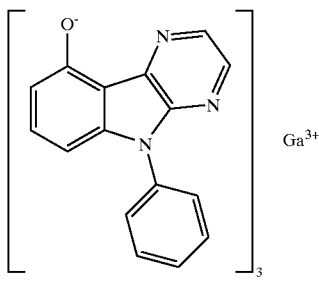 XXIII-8
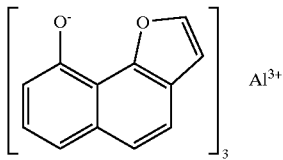 XXIV-1
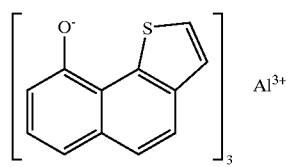 XXIV-2
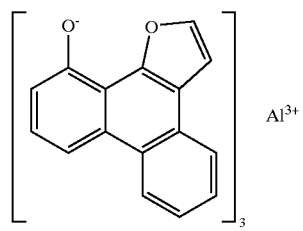 XXIV-3
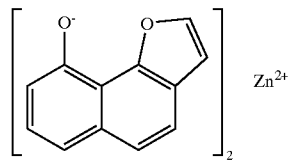 XXIV-4
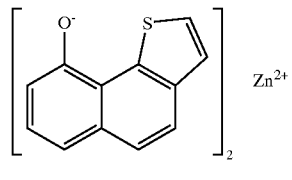 XXIV-5
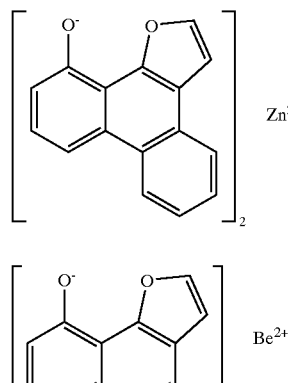 XXIV-6
XXIV-7
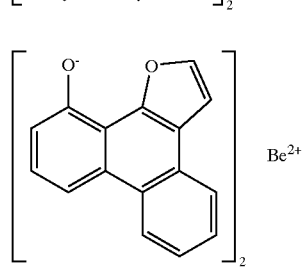 XXIV-8
XXIV-9

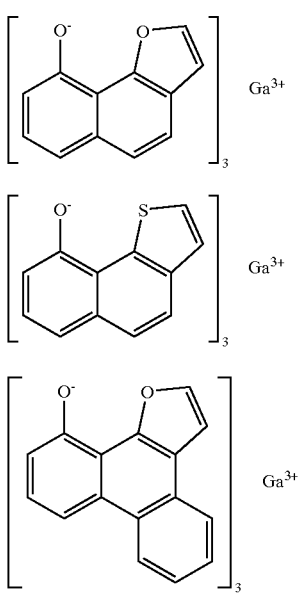

XXIV-10

XXIV-11

XXIV-12

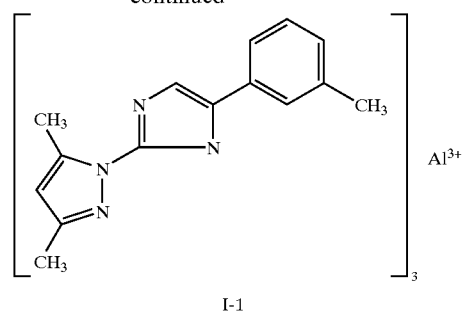

I-1

To 10 ml of toluene, 1.2 g of aluminum-i-propoxide was added and dissolved by heating at 70° C. To the solution, 3.75 g of compound A dissolved in 10 ml of toluene was added and stirred for 4 hours at 70° C. Precipitated white solid was cooled and filtered, and recrystallized using toluene. Thus 2.92 g of compound I-1 was obtained. It was confirmed by NMR and mass spectrum that the obtained substance was the objective substance.

The organic EL element in the invention basically has a structure in which a light emission layer is put between a pair of electrodes and a positive hole injection layer or an electron injection layer is provided according to necessity.

In concrete, the following structures are included.

(i) Anode/Light emission layer/Cathode
(ii) Anode/Positive hale injection layer/Light emission layer/Cathode
(iii) Anode/Light emission layer/Electron injection layer/Cathode
(iv) Anode/Positive hale injection layer/Light emission layer/Electron injection layer/Cathode The foregoing light emission layer has (1) an injection function accepting the positive hole injected from the anode or the positive hole injection layer and the electron injected from the cathode layer or the electron injection layer when an electric field is applied, (2) a transportation function transporting the injected electric charge, the electron and the positive hole, by the force of the electric field, and (3) a light emission function providing a field for recombination of the electron and the positive hole in the light emission layer and resulting emission of light. The transportation functions represented by the mobility of the positive hole and that of the electron may be different, and one having one of such the functions is preferable.

There is no limitation on the kind of the light emission material to be used in the light emission layer, and ones know as the light emission material in the organic EL element may be used. Such the light emission materials are mainly organic compounds, for example, the compounds described in Macromol. Synth., Vol. 125, p.p. 17–25 are usable according to required color.

The emission layer can be prepared employing materials mentioned above by a known method such as a evaporation method, a spin-coat method, a casting method and a LB method to form thin film. The layer is preferably a sedimentary molecule layer. The sedimentary molecule layer is a thin layer formed by sedimentation of the compound from a gas phase or a layer formed by solidifying from the molten or liquid phase of the compound. The sedimentary molecule layer can be distinguished from a thin layer formed by the LB method (cumulative molecule layer) based on the difference in the coagulation structure and the high dimensional structure, and in the functional difference thereof caused by the structural difference.

The following 1–3 are general synthesizing methods of compounds of present invention mentioned above.

1) A solution of a compound represented by one of Formulas I to XIV having a dissociative proton is added to a solution of a metal alkoxide such as aluminum-i-propoxide. The mixture is heated and stirred. The product is purified by a method such as reprecipitation and recrystallization to obtain the objective substance.

2) A solution of a compound represented by one of Formulas I to XIV having a dissociative proton is added to a suspension of a metal salt such as a metal halide, for example, zinc chloride. The mixture is heated and stirred. The product is purified by a method such as reprecipitation and recrystallization to obtain the objective substance.

3) A solution of a compound represented by one of Formulas I to XIV having a dissociative proton is added to a solution of an organic metal compound such as triethyl aluminum. The mixture is heated and stirred. The product is purified by a method such as reprecipitation and recrystallization to obtain the objective substance.

The synthesizing method of exemplified compound I-1 is shown below.

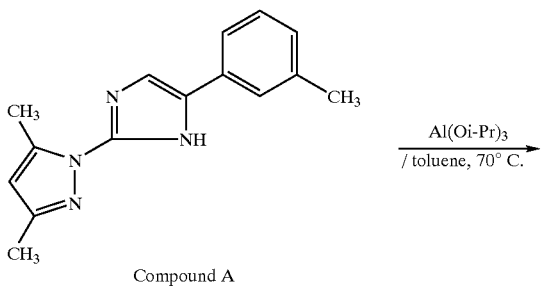

Compound A

Al(Oi-Pr)₃ / toluene, 70° C.

Moreover, the light emission layer can be formed by the method such as that described in JP O.P.I. No. 57-51781, by which the light emission material is dissolved in a solvent together with a binder such as a resin, and thus obtained solution is formed into a thin layer by a method such as spin-coat method.

Thickness of the emission layer thus prepared is not specially restricted. It is preferred that the thickness is within the range of from 5 nm to 5 µm, although the thickness of the layer thus formed may be optionally selected according to necessity without any limitation.

For the anode of the electroluminescent element, a metal, an alloy and an electroconductive compound each having a high working function of not less than 4 eV, and mixture thereof are preferably used as the electrode material. Concrete examples of such the electrode material include a metal such as Au, and a transparent electroconductive material such as CuI, indium oxide (ITO), $SnO_2$, ZnO and Zn-doped indium oxide (IZO).

The anode may be prepared by evaporating or spattering such the electrode material to form a thin layer, and forming the layer into a desired form by a photolithographic method. When required precision of the pattern is not so high (not less than 100 mm), the pattern may be formed by evaporating or spattering through a mask having a desired form.

When light is output through the anode, it is desired that the transparence of the anode is 10% or more, and the sheet resistivity of the anode is preferably not more than $10^3 \Omega/\square$. It is preferably within the range of from approximately 10 nm to 1 µm more preferably from 10 to 200 nm, although the thickness of the anode may be optionally selected.

On the other hand, for the cathode, a metal (also referred to an electron injection metal), an alloy, and an electroconductive compound each having a low working function (not more than 4 eV), and a mixture thereof are used as the material of electrode. Concrete examples of such the electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture and a rare-earth metal.

Among then, a mixture of an electron injection metal and a metal higher in the working function than that of the electron injection metal, such as the magnesium/silver mixture, magnesium/aluminum mixture, magnesium/indium mixture, aluminum/aluminum oxide ($Al_2O_3$) mixture and lithium/aluminum mixture, is suitable from the view point of the electron injection ability and the resistivity to oxidation.

The cathode can be prepared by making such the material to a thin layer by a method such as an evaporation or spattering method. The sheet resistivity of the cathode is preferably not more than $10^3 \Omega Y$, and the thickness of the cathode is preferably from 10 nm to 1 µm, more preferably from 50 to 2,000 nm. It is preferable for raising the light emission efficiency that the electrode arranged between the light emission layer and the color conversion layer is transparent or semi-transparent so as to permeate light therethrough.

In the invention, a positive hole injection layer, which may be provided according to necessity, has a function of transporting the positive hole injected from the anode to the light emission layer. Many positive holes can be injected in a lowered electric field by the presence of the positive hole injection layer between the anode and the light emission layer. Moreover, the light emission ability of the element is made excellent by raising the light emission efficiency since the electrons injected into the light emission layer from the cathode or the electron injection layer are accumulated at the interface in the light emission layer by a barrier to electron existing at the interface between the light emission layer and the positive hole injection layer.

The material to be used for the positive hole injection layer (hereinafter referred to a positive hole injection material) can be optionally selected from known materials without any limitation as far as having preferable property mentioned above, such materials as those employed for hole charge injection materials conventionally or known material for EL element in the hole injection layer.

The positive hole injection material may be either an organic substance or an inorganic substance as long as it has positive hole injection ability or an ability to form a barrier to electron. Examples of them include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styrylanthracene derivative, a fluorenone derivative, hydrazone derivative, stilbene derivative, silazane derivative, aniline copolymer, and electroconductive oligomer, particularly thiophene oligomer.

It is preferred to employ porphyrin compounds, aromatic tertiary amine compounds and styrylamine compounds, particularly, aromatic tertiary amine compounds in addition to the hole injection materials mentioned above. Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)phenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'—N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP O.P.I. No. 4-308688 such as 4,4',4"-tris[N-(3-methylphenyl)-N-phenylamino]-triphenylamine (MTDATA) in which three triphenylamine units are bonded in a starburst form.

As the inorganic positive hole injection material, p-Si and p-SiC are usable. The positive hole injection layer can be formed by making the positive hole injection material to a thin layer by a known method such as a vacuum evaporation method, a spin coat method a casting method and a LB method. The thickness of the positive hole injection layer is preferably approximately from 5 nm to 5 µm even though there is no specific limitation thereon.

The hole injection layer may be composed of single layer structure comprising one or two or more material mentioned above, or plural layers structure composed of single composition or disparate compositions. The electron injection layer which is provided according to necessity is a layer having a function of transporting electrons injected to the cathode to the light emission layer. The material of the electron injection layer may be optionally selected from known compounds.

Examples of the material of the electron injection layer (hereinafter referred to electron injection material) include a nitro-substituted fluorene derivative, a diphenylquinone derivative, a thiopyran dioxide derivative, a heterocyclic tetracarboxylic acid anhydride such as naphthaleneperylene, a carbodiimide, a fluolenylidenemethane derivative, an anthraquinodimethane and enthrone derivative, and a oxadiazole derivative. It is found by the inventors that a series of electron transmission compounds described in JP O.P.I. No. 59-194393 can be used as the electron injection material even though the compounds are described in the publication as the material for making the light emission layer. Moreover, a thiadiazole derivative which is formed by substituting the oxygen atom in the oxadiazole ring of the foregoing oxadiazole derivative by a sulfur atom, arylamino- or alkylamino-substituted triazole derivatives and a quinoxaline derivative having a quinoxaline ring known as an electron withdrawing group are usable as the electron injection material.

A metal complex of 8-quinolynol derivative such as aluminum tris-(8-quinolynol) (Alq), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), zinc bis-(8-quinolynol) (Znq), and a metal complex formed by replacing the central metal of the foregoing complexes with another metal atom such as In, Mg, Cu, Ca, Sn, Ga or Pb, can be used as the electron injection material. Furthermore, a metal free and metal-containing phthalocyanine, and a derivative thereof in which the terminal of each of the compounds is replaced by a substituent such as an alkyl group or a sulfonic acid group are also preferably used as the electron injection material. Distyrylpyrazine derivative exemplified as a material for emission layer may preferably be employed as the electron injection material. An inorganic semiconductor such as n-Si and n-SiC may also be used as the electron injection material similar to the hole injection layer.

The electron injection layer can be formed by making the electron injection material to a thin layer by a known method such as a vacuum evaporation method, a spin coat method a casting method and a LB method. The thickness of the positive hole injection layer is preferably approximately from 5 nm to 5 µm even though there is no specific limitation thereon.

The electron injection layer may have a single layer structure containing one or more kinds of the electron injection material or a multi-layered structure composed of plural layers having the same or different composition.

Preferable examples of preparation of the organic EL element is described below.

For example, the preparation of the EL element having the foregoing constitution of Anode/Positive hole injection layer/Light emission layer/Electron injection layer/Cathode is described. On a suitable substrate, a thin layer of a desired material for electrode such as an anode material is formed by an evaporation or spattering method so that the thickness of the layer is not more than 1 µm, preferably within the range of from 10 to 200 nm to prepare the anode. Then thin layers of a material of the positive hole injection layer, a material of the light emission layer and a material of the electron injection layer are formed on the anode.

The compounds of Formula I through XXIV according to the invention may be contained in any of the positive hole injection layer, positive hole transporting layer, light emission layer, electron injection layer and electron transporting layer, and the compound may form a layer singly or together with another compound.

For formation of the thin layer, a vacuum evaporation method is preferably used even though a spin coating method, a casting method and an evaporation method can be used. The vacuum evaporation method is preferable since a uniform layer can be formed and a pinhole is formed with difficulty when the layer formed by such the method. It is preferable to optionally select the conditions of the vacuum evaporation in the ranges of the boat heating temperature of from 50° C. to 450° C., the vacuum degree of from $10^{-6}$ to $10^{-3}$ Pa, the evaporation speed of from 0.01 to 50 nm/second, the substrate temperature of from −50° C. to 300° C., and the thickness of from 5 nm to 5 µm.

After formation of these layers, a thin layer comprising a material for cathode is formed thereon by, for example, an evaporation method or spattering method so that the thickness is not more than 1 µm, preferably from 50 to 200 nm, to provide the cathode. Thus a desired EL element is obtained.

It is preferable that the preparation of the EL element is continuously carried out from the formation of the positive hole injection layer to that of the cathode under one time of vacuuming. However, the organic EL element can be prepared in the reverse order, the formation of the cathode, the electron injection layer, the light emission layer, the positive hole injection layer and the anode.

Light emission can be observed when a direct current with a voltage of from about 5 to 40 V is applied to thus prepared organic EL element so that the polarity of the anode is positive and that of the cathode is negative. When the voltage is applied in the reverse polarity, no current is formed and light is not emitted at all. When an alternating current is applied, light is emitted only when the polarity of the node is positive and that of the cathode is negative. The shape of the wave of the alternating current may be optionally selected.

EXAMPLES

The invention is described according to examples below. The embodiment of the invention is not limited to the examples.

Example 1

(Preparation of an Organic EL Element for Comparison)

A glass substrate plate on which a layer of ITO of 150 nm was provided, NA-45 manufactured by NH Techo-glass Co., Ltd., was patterned to form an anode. The substrate plate, on which the ITO transparent electrode is provided, was subjected to ultrasonic washing by i-propyl alcohol and dried by nitrogen gas, and further subjected to UV-ozone cleaning for 5 minutes. Thus prepared transparent substrate plate is fixed on a holder of a usual vacuum evaporation apparatus available on the market. On the other hand, 200 mg of N,N'-diphenyl-N,N'-bis(3-methyl-phenyl)[1,1'-biphenyl]-4,4'-diamine (TPD) was put in a molybdenum resistive heating boat and 200 mg of comparative compound Q-1 shown in Table 1 was put in another molybdenum resistive heating boat, and the boats were installed in the vacuum evaporation apparatus.

Then the pressure in the vacuum tank was reduced by $4 \times 10^{-4}$ Pa, and the heating boat carrying TPD was heated by 220° C. applying an electric current for evaporating TPD on the transparent substrate plate in an evaporation speed of 0.1 to 0.3 nm/second to provide a positive hole injection layer having a thickness of 60 nm. Moreover, the heating boat carrying compound Q-1 was heated by 220° C. by applying an electric current for evaporating Q-1 on the positive hole injection layer in a speed of 0.1 to 0.3 nm/second to form a light emission layer having a thickness of 40 nm. The temperature of the substrate at the time of evaporation was a room temperature.

Then the vacuum tank was opened and a stainless steel mask having a rectangular hole was set on the electron injection layer. Besides, 3 g of magnesium was put into a molybdenum resistive heating boat, 0.5 g of silver was put into a basket for evaporating, and the boat and the basked were installed in the vacuum tank. The pressure in the vacuum tank was reduced by $2\times10^{-4}$ Pa. Then an electric current was applied to the boat carrying magnesium to evaporate magnesium in an evaporation speed of 1.5 to 2.0 nm/second. At the same time, silver was evaporated in an evaporation speed of 0.1 nm/second by heating the basket carrying silver. Thus a comparative organic EL element OLED-1 shown in Table 1 was prepared which has a counter electrode composed of a mixture of magnesium and silver.

Comparative organic EL elements OLED-2 to OLED-12 were prepared in the same manner as in OLED-1 except that the compound Q-1 was respectively replaced by comparative compounds Q-2 through Q-12 as shown in Table 1.

Q-1
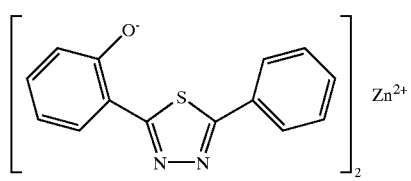

Q-2
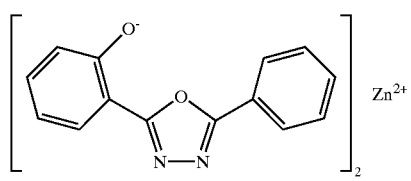

Q-3
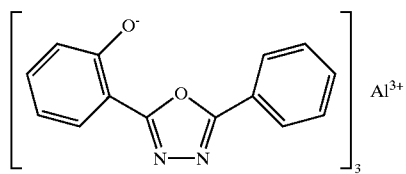

Q-4
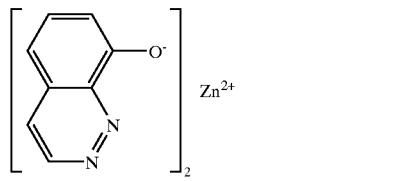

Q-5
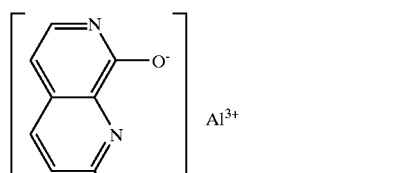

-continued

Q-6
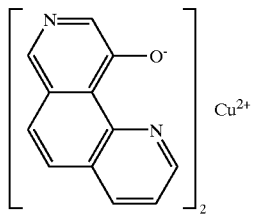

Q-7
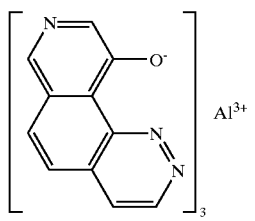

Q-8
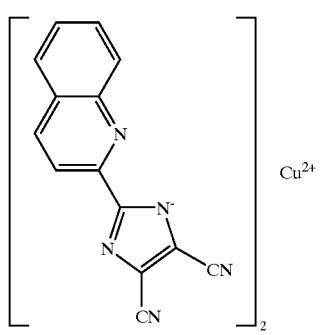

Q-9
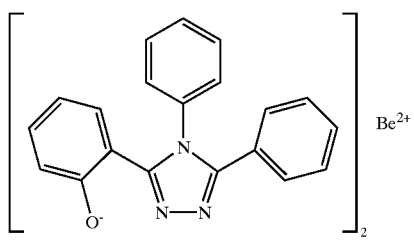

Q-10
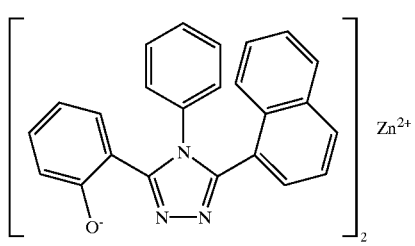

Q-11
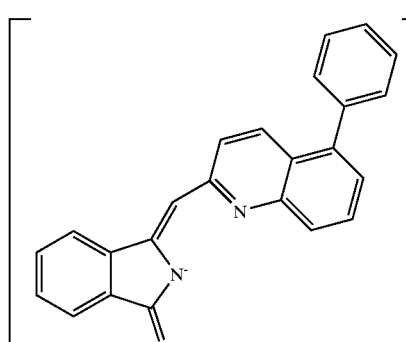

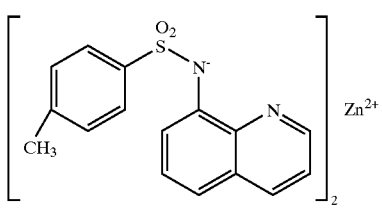

Q-12

Organic EL elements OLED-13 to OLED-126 according to the invention were prepared in the same manner as in OLED-1 except that compound Q-1 was replaced by the compound according to the invention as shown in Tables 1 to 3.

To each of the above prepared organic EL elements OLED-13 to OLED-126 each according to the invention and the comparative organic EL elements OLED-1 to OLED-12 10 V of direct current was applied so that the ITO electrode is anode and the counter electrode composed of magnesium and silver was cathode, and the luminance of emitted light was evaluated.

Results of the evaluation are shown in Tables 1 to 3. In the tables, the maximum luminance of emitted light of each of the elements is represented by a relative value when the maximum luminance of emitted light of comparative organic EL element OLED-1 is set at 1.00.

TABLE 1

| OLED No. | Compound in Light emission layer | Maximum luminance (Relative value) |
|---|---|---|
| 1(Comp.) | Q-1 | 1.0 |
| 2(Comp.) | Q-2 | 1.2 |
| 3(Comp.) | Q-3 | 0.4 |
| 4(Comp.) | Q-4 | 0.5 |
| 5(Comp.) | Q-5 | 1.3 |
| 6(Comp.) | Q-6 | 1.5 |
| 7(Comp.) | Q-7 | 1.9 |
| 8(Comp.) | Q-8 | 1.5 |
| 9(Comp.) | Q-9 | 1.5 |
| 10(Comp.) | Q-10 | 1.9 |
| 11(Comp.) | Q-11 | 1.5 |
| 12(Comp.) | Q-12 | 1.0 |
| 13(Inv.) | I-1 | 20 |
| 14(Inv.) | I-2 | 20 |
| 15(Inv.) | I-8 | 16 |
| 16(Inv.) | I-11 | 15 |
| 17(Inv.) | I-14 | 19 |
| 18(Inv.) | I-20 | 18 |
| 19(Inv.) | I-22 | 18 |
| 20(Inv.) | I-23 | 17 |
| 21(Inv.) | I-25 | 16 |
| 22(Inv.) | I-32 | 16 |
| 23(Inv.) | II-1 | 18 |
| 24(Inv.) | II-6 | 16 |
| 25(Inv.) | II-10 | 17 |
| 26(Inv.) | II-13 | 18 |
| 27(Inv.) | III-1 | 17 |
| 28(Inv.) | III-10 | 16 |
| 29(Inv.) | III-14 | 16 |
| 30(Inv.) | III-16 | 17 |
| 31(Inv.) | IV-1 | 18 |
| 32(Inv.) | IV-8 | 17 |
| 33(Inv.) | IV-9 | 16 |
| 34(Inv.) | IV-15 | 18 |
| 35(Inv.) | V-1 | 18 |
| 36(Inv.) | V-6 | 15 |
| 37(Inv.) | V-11 | 15 |
| 38(Inv.) | V-16 | 17 |
| 39(Inv.) | VI-1 | 17 |
| 40(Inv.) | VI-6 | 16 |
| 41(Inv.) | VI-9 | 16 |

TABLE 1-continued

| OLED No. | Compound in Light emission layer | Maximum luminance (Relative value) |
|---|---|---|
| 42(Inv.) | VI-16 | 16 |
| 43 Inv. | VII-1 | 19 |
| 44(Inv.) | VII-8 | 18 |
| 45(Inv.) | VII-11 | 16 |
| 46(Inv.) | VII-16 | 19 |
| 47(Inv.) | VIII-1 | 18 |
| 48(Inv.) | VIII-8 | 16 |
| 49(Inv.) | VIII-11 | 17 |
| 50(Inv.) | VIII-14 | 18 |

Comp.: Comparative   Inv.: Inventive

TABLE 2

| OLED No. | Compound in Light emission layer | Maximum luminance (Relative value) |
|---|---|---|
| 51(Inv.) | IX-1 | 19 |
| 52(Inv.) | IX-3 | 18 |
| 53(Inv.) | IX-8 | 19 |
| 54(Inv.) | IX-11 | 16 |
| 55(Inv.) | IX-13 | 17 |
| 56(Inv.) | IX-21 | 18 |
| 57(Inv.) | X-2 | 18 |
| 58(Inv.) | X-6 | 15 |
| 59(Inv.) | X-13 | 15 |
| 60(Inv.) | X-20 | 16 |
| 61(Inv.) | XI-1 | 16 |
| 62(Inv.) | XI-9 | 16 |
| 63(Inv.) | XI-18 | 15 |
| 64(Inv.) | XI-23 | 16 |
| 65(Inv.) | XII-1 | 17 |
| 66(Inv.) | XII-6 | 17 |
| 67(Inv.) | XII-11 | 15 |
| 68(Inv.) | XII-13 | 16 |
| 69(Inv.) | XIII-1 | 18 |
| 70(Inv.) | XIII-3 | 19 |
| 71(Inv.) | XIII-8 | 18 |
| 72(Inv.) | XIII-12 | 18 |
| 73(Inv.) | XIII-14 | 17 |
| 74(Inv.) | VIII-18 | 17 |
| 75(Inv.) | VIII-27 | 17 |
| 76(Inv.) | XIII-29 | 15 |
| 77(Inv.) | XIII-37 | 16 |
| 78(Inv.) | XIII-43 | 18 |
| 79(Inv.) | XIV-1 | 19 |
| 80(Inv.) | XIV-4 | 19 |
| 81(Inv.) | XIV-5 | 17 |
| 82(Inv.) | XIV-11 | 17 |
| 83(Inv.) | XIV-16 | 16 |
| 84(Inv.) | XIV-19 | 16 |
| 85(Inv.) | XIV-21 | 17 |
| 86(Inv.) | XIV-24 | 16 |
| 87(Inv.) | XV-1 | 18 |
| 88(Inv.) | XV-6 | 15 |
| 89(Inv.) | XV-11 | 15 |
| 90(Inv.) | XV-16 | 16 |
| 91(Inv.) | XVI-1 | 17 |
| 92(Inv.) | XVI-6 | 17 |
| 93(Inv.) | XVI-8 | 15 |
| 94(Inv.) | XVI-10 | 17 |
| 95(Inv.) | XVII-1 | 19 |
| 96(Inv.) | XVII-5 | 17 |
| 97(Inv.) | XVII-7 | 17 |
| 98(Inv.) | XVII-12 | 18 |
| 99(Inv.) | XVIII-1 | 19 |
| 100(Inv.) | XVIII-3 | 18 |

Comp.: Comparative   Inv.: Inventive

TABLE 3

| OLED No. | Compound in Light emission layer | Maximum luminance (Relative value) |
|---|---|---|
| 101(Inv.) | XVIII-6 | 16 |
| 102(Inv.) | XVIII-7 | 17 |
| 103(Inv.) | XIX-1 | 17 |
| 104(Inv.) | XIX-6 | 16 |
| 105(Inv.) | XIX-8 | 16 |
| 106(Inv.) | XIX-10 | 17 |
| 107(Inv.) | XX-2 | 18 |
| 108(Inv.) | XX-4 | 16 |
| 109(Inv.) | XX-8 | 15 |
| 110(Inv.) | XX-12 | 17 |
| 111(Inv.) | XXI-3 | 19 |
| 112(Inv.) | XXI-4 | 18 |
| 113(Inv.) | XXI-9 | 17 |
| 114(Inv.) | XXI-11 | 17 |
| 115(Inv.) | XXII-1 | 17 |
| 116(Inv.) | XXII-4 | 16 |
| 117(Inv.) | XXII-6 | 16 |
| 118(Inv.) | XXII-7 | 17 |
| 119(Inv.) | XXIII-1 | 18 |
| 120(Inv.) | XXIII-4 | 18 |
| 121(Inv.) | XXIII-6 | 16 |
| 122(Inv.) | XXIII-7 | 17 |
| 123(Inv.) | XXIV-2 | 17 |
| 124(Inv.) | XXIV-6 | 15 |
| 125(Inv.) | XX1V-7 | 15 |
| 126(Inv.) | XXIV-11 | 16 |

Comp.: Comparative  Inv.: Inventive

It is clear that the high luminance of emitted light. can be obtained by the compounds according to the invention.

Example 2
(Preparation of Organic EL Element According to the Invention)

A glass substrate plate on which a layer of ITO having a thickness of 150 nm (the foregoing NA-45) as an anode was subjected to patterning. The substrate plate on which the ITO transparent electrode is provided was subjected to ultrasonic washing by i-propyl alcohol and dried by nitrogen gas, and further subjected to UV-ozone cleaning for 5 minutes. Thus prepared transparent substrate plate is fixed on a holder of a usual vacuum evaporation apparatus available on the market. On the other hand, 200 mg of N,N'-diphenyl-N,N'-bis(3-methyl-phenyl)[1,1'-biphenyl]-4,4'-diamine (TPD) was put in a molybdenum resistive heating boat, and 200 mg of the compound according to the invention I-1 was put in another molybdenum resistive heating boat. Furthermore 200 mg of tris(8-hydroxyquinolinate)aluminum ($Alq_3$) was put in another molybdenum resistive heating boat. These boats were installed in the vacuum evaporation apparatus.

Then the pressure in the vacuum tank was reduced by $4 \times 10^{-4}$ Pa, and the heating boat carrying TPD was heated by 220° C. by applying an electric current to evaporate TPD on the transparent substrate plate in an evaporation speed of 0.1 to 0.3 nm/second for providing a positive hole injection layer having a thickness of 60 nm. Next, the heating boat carrying compound I-1 of the invention was heated by 220° C. by applying an electric current to evaporate compound I-1 in a speed of 0.1 to 0.3 nm/second on the positive hole injection layer for providing a light emission layer having a thickness of 40 nm. Moreover, the heating boat carrying $Alq_3$ was heated by 250° C. by applying an electric current to evaporate $Alq_3$ in a speed of 0.1 nm/second for providing an electron injection layer having a thickness of 20 nm. The temperature of the substrate at the time of evaporation was a room temperature. Then the vacuum tank was opened and a stainless steel mask having a rectangular hole was set on the electron injection layer. Besides, 3 g of magnesium was put into a molybdenum resistive heating boat, 0.5 g of silver was put into a basket for evaporating, and the boat and the basked were installed in the vacuum tank. The pressure in the vacuum tank was reduced by $2 \times 10^{-4}$ Pa. Then an electric current was applied to the boat carrying magnesium to evaporate magnesium in an evaporation speed of 1.5 to 2.0 nm/second. At the same time, silver was evaporated in an evaporation speed of 0.1 nm/second by heating the basket carrying. silver. Thus an organic EL element OLED-13 having a counter electrode composed of a mixture of magnesium and silver was prepared. When 12 V of a direct current was applied to the element so that the ITO electrode is the anode and the counter electrode composed of magnesium and silver was the cathode, light having a high luminance was emitted.

As above described, an organic electroluminescent element excellent in the light emission efficiency and capable of emitting light with a high luminance can be provided by the invention.

What is claimed is:

1. An organic electroluminescent element comprising a light emission layer comprised of single or plural thin layers of an organic compound put between an anode and a cathode facing to each other, in which at least one of the thin layer of the organic compound contains an organic metal complex having both of an ionic coordinate bond formed between a nitrogen anion and a metal cation and a coordinate bond formed by a nitrogen atom or a chalcogen and a metal, wherein the organic metal complex contains a salt of the anion of a compound represented by one of Formulas I to XII and a metal cation,

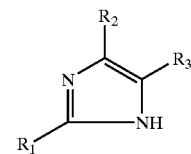

Formula I wherein $R_1$, $R_2$ and $R_3$ are each a hydrogen atom or a substituent having a Hammett's value of from −1.00 to 0.65, or $R_2$ and $R_3$ are bonded with each other to form a ring condensed with the imidazole ring, and at least one of $R_1$, $R_2$ and $R_3$ has a nitrogen atom or a chalcogen atom at a position far from 2 or 3 atoms from the nitrogen atom forming an ionic coordinate bond with a metal cation;

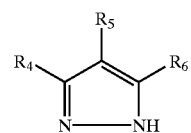

Formula II wherein $R_4$, $R_5$ and $R_6$ are each a hydrogen atom or a substituent, $R_4$ and $R_5$ or $R_5$ and $R_6$ may be bonded with each other to a ring condensed with the pyrazole ring, and at least one of $R_4$, $R_5$ and $R_6$ has a nitrogen atom or a chalcogen atom at a position far from 2 or 3 atoms from the nitrogen atom forming an ionic coordinate bond with a metal cation;

Formula III

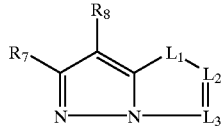

wherein $L_1$ is an —N($R_9$)— group or a —C($R_{10}$)($R_{11}$)— group, $L_2$ is a nitrogen atom or a —C($R_{12}$)= group, $L_3$ is a nitrogen atom or a =C($R_{13}$)— group, $R_7$, $R_8$, $R_9$, $R_{10}$, $R_{11}$ and $R_{13}$ are each a hydrogen atom or a substituent, $R_7$ and $R_8$ may be bonded with each other to form a ring condensed with the pyrazole ring, and at least one of $R_7$ through $R_{13}$ has a nitrogen atom or a chalcogen atom at a position far from 2 or 3 atoms from the nitrogen atom forming an ionic coordinate bond with a metal cation;

Formula IV

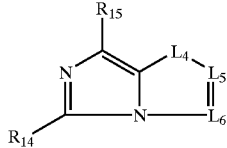

wherein $L_4$ is an —N($R_{16}$)— group or a —C($R_{17}$)($R_{18}$)— group, $L_5$ is a nitrogen atom or a —C($R_{19}$)= group, $L_6$ is a nitrogen atom or a =C($R_{20}$)— group, $R_{14}$, $R_{15}$, $R_{16}$, $R_{17}$, $R_{18}$, $R_{19}$ and $R_{20}$ are each a hydrogen atom or a substituent, and at least one of $R_{14}$ through $R_{20}$ has a nitrogen atom or a chalcogen atom at a position far from 2 or 3 atoms from the nitrogen atom forming an ionic coordinate bond with a metal cation;

Formula V

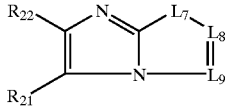

wherein $L_7$ is an —N($R_{23}$)— group or a —C($R_{24}$)($R_{25}$)— group, $L_8$ is a nitrogen atom or a —C($R_{26}$)= group, $L_9$ is a nitrogen atom or a =C($R_{27}$)— group, $R_{21}$, $R_{22}$, $R_{23}$, $R_{24}$, $R_{25}$, $R_{26}$ and $R_{27}$ are each a hydrogen atom or a substituent, $R_{21}$ and $R_{22}$ may be bonded with each other to form a ring condensed with the pyrazole ring, and at least one of $R_{21}$ through $R_{27}$ has a nitrogen atom or a chalcogen atom at a position far from 2 or 3 atoms from the nitrogen atom forming an ionic coordinate bond with a metal cation.

Formula VI

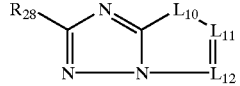

wherein $L_{10}$ is an —N($R_{29}$)— group or a —C($R_{30}$)($R_{31}$)— group, $L_{11}$ is a nitrogen atom or a —C($R_{32}$)= group, $L_{12}$ is a nitrogen atom or a =C($R_{33}$)— group, $R_{28}$, $R_{29}$, $R_{30}$, $R_{31}$, $R_{32}$, and $R_{33}$ are each a hydrogen atom or a substituent, and at least one of $R_{28}$ through $R_{33}$ has a nitrogen atom or a chalcogen atom at a position far from 2 or 3 atoms from the nitrogen atom forming an ionic coordinate bond with a metal cation;

Formula VII

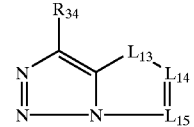

wherein $L_{13}$ is an —N($R_{35}$)— group or a —C($R_{36}$)($R_{37}$)— group, $L_{14}$ is a nitrogen atom or a —C($R_{38}$)= group, $L_{15}$ is a nitrogen atom or a =C($R_{39}$)— group, $R_{34}$, $R_{35}$, $R_{36}$, $R_{37}$, $R_{38}$ and $R_{39}$ are each a hydrogen atom or a substituent, and at least one of $R_{34}$, $R_{35}$, $R_{36}$, $R_{37}$, $R_{38}$ and $R_{39}$ has a nitrogen atom or a chalcogen atom at a position far from 2 or 3 atoms from the nitrogen atom forming an ionic coordinate bond with a metal cation;

Formula VIII

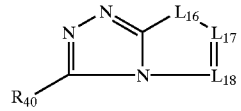

wherein $L_{16}$ is an —N($R_{41}$)— group or a —C($R_{42}$)($R_{43}$)— group, $L_{17}$ is a nitrogen atom or a —C($R_{44}$)= group, $L_{18}$ is a nitrogen atom or a =C($R_{45}$)— group, $R_{40}$, $R_{41}$, $R_{42}$, $R_{43}$, $R_{44}$ and $R_{45}$ are each a hydrogen atom or a substituent, and at least one of $R_{40}$ through $R_{45}$ has a nitrogen atom or a chalcogen atom at a position far from 2 or 3 atoms from the nitrogen atom forming an ionic coordinate bond with a metal cation;

Formula IX

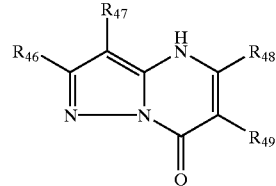

wherein $R_{46}$, $R_{47}$, $R_{48}$ and $R_{49}$ are each a hydrogen atom or a substituent, $R_{46}$ and $R_{47}$ may be bonded with each other to form a ring condensed with the pyrazole ring, $R_{48}$ and $R_{49}$ may be bonded with each other to form a ring condensed with the imidazole ring, and at least one of $R_{46}$ through $R_{49}$ has a nitrogen atom or a chalcogen atom at a position far from 2 or 3 atoms from the nitrogen atom forming an ionic coordinate bond with a metal cation;

Formula X

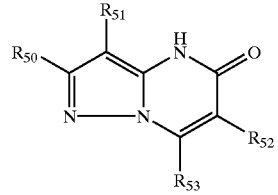

wherein $R_{50}$, $R_{51}$, $R_{52}$ and $R_{53}$ are each a hydrogen atom or a substituent, $R_{50}$ and $R_{51}$ may be bonded with each other to form a ring condensed with the pyrazole ring, $R_{52}$ and $R_{53}$ may be bonded with each other to form a ring condensed with the pyrimidine ring, and at least one of $R_{50}$ through $R_{50}$ has a nitrogen atom or a chalcogen atom at a position far from 2 or 3 atoms from the nitrogen atom forming an ionic coordinate bond with a metal cation;

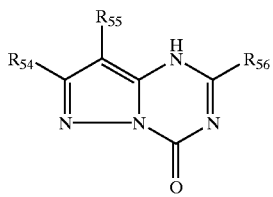

Formula XI wherein $R_{54}$, $R_{55}$ and $R_{56}$ are each a hydrogen atom or a substituent, $R_{54}$ and $R_{55}$ may be bonded with each other to form a ring condensed with the pyrazoe ring, and at least one of $R_{54}$, $R_{55}$ and $R_{56}$ has a nitrogen atom or a chalcogen atom at a position far from 2 or 3 atoms from the nitrogen atom forming an ionic coordinate bond with a metal cation; and

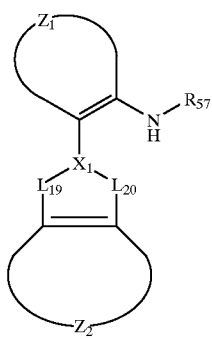

Formula XII wherein $Z_1$ and $Z_2$ are each a group of atoms necessary to form a 5- or 6-member ring, $R_{57}$ is a substituent, $X_1$ is a nitrogen atom or a carbon atom $L_{19}$ and $L_{20}$ are each an —N=, an —N($R_{58}$)— group, an —O—, an —S— or a —Se—, and $R_{58}$ is a substituent.

2. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by formula I and a metal cation,

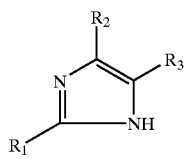

Formula I wherein $R_1$, $R_2$ and $R_3$ are each a hydrogen atom or a substituent having a Hammett's value of from −1.00 to 0.65, or $R_2$ and $R_3$ are bonded with each other to form a ring condensed with the imidazole ring, and at least one of $R_1$, $R_2$ and $R_3$ has a nitrogen atom or a chalcogen atom at a position far from 2 or 3 atoms from the nitrogen atom forming an ionic coordinate bond with a metal cation.

3. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula II and a metal cation,

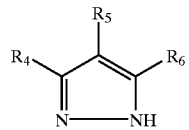

Formula II wherein $R_4$, $R_5$ and $R_6$ are each a hydrogen atom or a substituent, $R_4$ and $R_5$ or $R_5$ and $R_6$ may be bonded with each other to a ring condensed with the pyrazole ring, and at least one of $R_4$, $R_5$ and $R_6$ has a nitrogen atom or a chalcogen atom at a position far from 2 or 3 atoms from the nitrogen atom forming an ionic coordinate bond with a metal cation.

4. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula III and a metal cation,

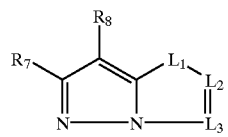

Formula III wherein $L_1$ is an —N($R_9$)— group or a —C($R_{10}$)($R_{11}$)— group, $L_2$ is a nitrogen atom or a —C($R_{12}$)= group, $L_3$ is a nitrogen atom or a =C($R_{13}$)— group, $R_7$, $R_8$, $R_9$, $R_{10}$, $R_{11}$ and $R_{13}$ are each a hydrogen atom or a substituent, $R_7$ and $R_8$ may be bonded with each other to form a ring condensed with the pyrazole ring, and at least one of $R_7$ through $R_{13}$ has a nitrogen atom or a chalcogen atom at a position far from 2 or 3 atoms from the nitrogen atom forming an ionic coordinate bond with a metal cation.

5. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula IV and a metal cation,

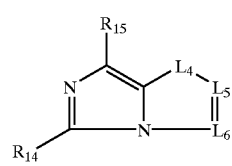

Formula IV wherein $L_4$ is an —N($R_{16}$)— group or a —C($R_{17}$)($R_{18}$)— group, $L_5$ is a nitrogen atom or a —C($R_{19}$)= group, $L_6$ is a nitrogen atom or a =C($R_{20}$)— group, $R_{14}$, $R_{15}$, $R_{16}$, $R_{17}$, $R_{18}$, $R_{19}$ and $R_{20}$ are each a hydrogen atom or a substituent, and at least one of $R_{14}$ through $R_{20}$ has a nitrogen atom or a chalcogen atom at a position far from 2 or 3 atoms from the nitrogen atom forming an ionic coordinate bond with a metal cation.

6. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula V and a metal cation,

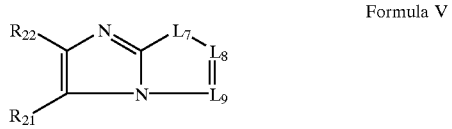

Formula V wherein $L_7$ is an —$N(R_{23})$— group or a —$C(R_{24})(R_{25})$— group, $L_8$ is a nitrogen atom or a —$C(R_{26})$= group, $L_9$ is a nitrogen atom or a =$C(R_{27})$— group, $R_{21}$, $R_{22}$, $R_{23}$, $R_{24}$, $R_{25}$, $R_{26}$ and $R_{27}$ are each a hydrogen atom or a substituent, $R_{21}$ and $R_{22}$ may be bonded with each other to form a ring condensed with the pyrazole ring, and at least one of $R_{21}$ through $R_{27}$ has a nitrogen atom or a chalcogen atom at a position far from 2 or 3 atoms from the nitrogen atom forming an ionic coordinate bond with a metal cation.

7. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula VI and a metal contan,

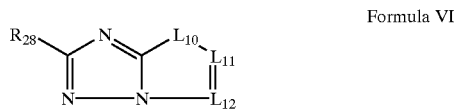

Formula VI wherein $L_{10}$ is an —$N(R_{29})$— group or a —$C(R_{30})(R_{31})$— group, $L_{11}$ is a nitrogen atom or a —$C(R_{32})$= group, $L_{12}$ is a nitrogen atom or a =$C(R_{33})$— group, $R_{28}$, $R_{29}$, $R_{30}$, $R_{31}$, $R_{32}$, and $R_{33}$ are each a hydrogen atom or a substituent, and at least one of $R_{28}$ through $R_{33}$ has a nitrogen atom or a chalcogen atom at a position far from 2 or 3 atoms from the nitrogen atom forming an ionic coordinate bond with a metal cation.

8. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula VII and a metal cation,

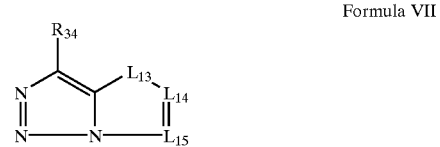

Formula VII wherein $L_{13}$ is an —$N(R_{35})$— group or a —$C(R_{36})(R_{37})$— group, $L_{14}$ is a nitrogen atom or a —$C(R_{38})$= group, $L_{15}$ is a nitrogen atom or a =$C(R_{39})$— group, $R_{34}$, $R_{35}$, $R_{36}$, $R_{37}$, $R_{38}$ and $R_{39}$ are each a hydrogen atom or a substituent, and at least one of $R_{34}$, $R_{35}$, $R_{36}$, $R_{37}$, $R_{38}$ and $R_{39}$ has a nitrogen atom or a chalcogen atom at a position far from 2 or 3 atoms from the nitrogen atom forming an ionic coordinate bond with a metal cation.

9. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula VIII and a metal cation,

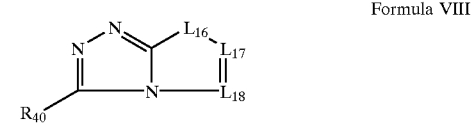

Formula VIII wherein $L_{16}$ is an —$N(R_{41})$— group or a —$C(R_{42})(R_{43})$— group, $L_{17}$ is a nitrogen atom or a —$C(R_{44})$= group, $L_{18}$ is a nitrogen atom or a =$C(R_{45})$— group, $R_{40}$, $R_{41}$, $R_{42}$, $R_{43}$, $R_{44}$ and $R_{45}$ are each a hydrogen atom or a substituent, and at least one of $R_{40}$ through $R_{45}$ has a nitrogen atom or a chalcogen atom at a position far from 2 or 3 atoms from the nitrogen atom forming an ionic coordinate bond with a metal cation.

10. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula IX and a metal cation,

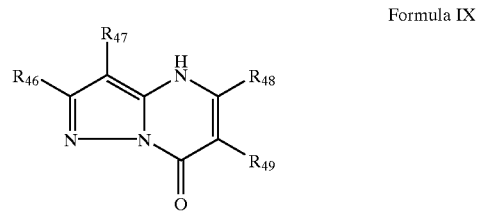

Formula IX wherein $R_{46}$, $R_{47}$, $R_{48}$ and $R_{49}$ are each a hydrogen atom or a substituent, $R_{46}$ and $R_{47}$ may be bonded with each other to form a ring condensed with the pyrazole ring, $R_{48}$ and $R_{49}$ may be bonded with each other to form a ring condensed with the imidazole ring, and at least one of $R_{46}$ through $R_{49}$ has a nitrogen atom or a chalcogen atom at a position far from 2 or 3 atoms from the nitrogen atom forming an ionic coordinate bond with a metal cation.

11. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula X and a metal cation,

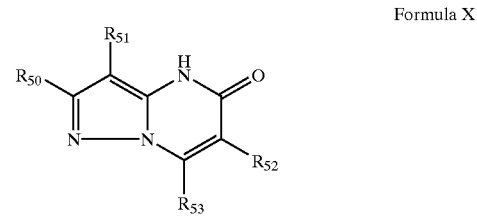

Formula X wherein $R_{50}$, $R_{51}$, $R_{52}$ and $R_{53}$ are each a hydrogen atom or a substituent, $R_{50}$ and $R_{51}$ may be bonded with each other to form a ring condensed with the pyrazole ring, $R_{52}$ and $R_{53}$ may be bonded with each other to form a ring condensed with the pyrimidine ring, and at least one of $R_{50}$ through $R_{53}$ has a nitrogen atom or a chalcogen atom at a position far from 2 or 3 atoms from the nitrogen atom forming an ionic coordinate bond with a metal cation.

12. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula XI and a metal cation,

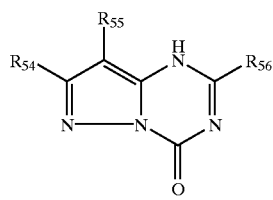

Formula XI wherein $R_{54}$, $R_{55}$ and $R_{56}$ are each a hydrogen atom or a substituent, $R_{54}$ and $R_{55}$ may be bonded with each other to form a ring condensed with the pyrazole ring, and at least one of $R_{54}$, $R_{55}$ and $R_{56}$ has a nitrogen atom or a chalcogen atom at a position far from 2 or 3 atoms from the nitrogen atom forming an ionic coordinate bond with a metal cation.

13. The organic electroluminescent element of claim 1 comprising a light emission layer comprised of single or plural thin layers of an organic compound put between an anode and a cathode facing to each other, in which at least one of the thin layer of the organic compound contains a salt of the anion of a compound represented by Formula XII and a metal cation,

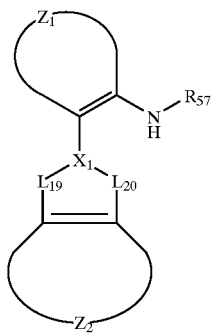

Formula XII wherein $Z_1$ and $Z_2$ are each a group of atoms necessary to form a 5- or 6-member ring, $R_{57}$ is a substituent, $X_1$ is a nitrogen atom or a carbon atom, $L_{19}$ and $L_{20}$ are each an —N=, an —N($R_{58}$)— group, an —O—, an —S— or a —Se—, and $R_{58}$ is a substituent.

14. The organic electroluminescent element of claim 1 wherein the metal element of the metal cation of the organic metal complex is Al, Ga, In, Tl, Be, Mg, Sr, Ba, Ca, Zn, Cd, Hg, Pd or Cu.

* * * * *